(12) United States Patent
Lin et al.

(10) Patent No.: US 8,334,203 B2
(45) Date of Patent: Dec. 18, 2012

(54) INTERCONNECT STRUCTURE AND METHOD OF FABRICATING

(75) Inventors: Qinghuang Lin, Yorktown Heights, NY (US); Dirk Pfeiffer, Dobbs Ferry, NY (US); Ratnam Sooriyakumaran, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 266 days.

(21) Appl. No.: 12/814,162

(22) Filed: Jun. 11, 2010

(65) Prior Publication Data
US 2011/0304053 A1  Dec. 15, 2011

(51) Int. Cl.
*H01L 21/4763* (2006.01)

(52) U.S. Cl. ........ 438/623; 438/629; 438/708; 438/700; 438/694; 438/789; 438/790; 257/E21.587; 257/E21.579

(58) Field of Classification Search ........... 257/E21.579, 257/E21.587; 438/623, 629, 708, 700, 694, 438/789, 790
See application file for complete search history.

(56) References Cited

U.S. PATENT DOCUMENTS

| | | | |
|---|---|---|---|
| 4,371,605 A | 2/1983 | Renner | |
| 6,087,064 A | 7/2000 | Lin et al. | |
| 7,041,748 B2 | 5/2006 | Lin et al. | |
| 7,056,840 B2 | 6/2006 | Miller et al. | |
| 7,306,853 B2 | 12/2007 | Lin et al. | |
| 7,714,079 B2 | 5/2010 | Lin et al. | |
| 2004/0161927 A1* | 8/2004 | Hu et al. | 438/653 |
| 2008/0017984 A1 | 1/2008 | Farooq et al. | |
| 2008/0028467 A1 | 1/2008 | Kommareddy et al. | |
| 2009/0079076 A1 | 3/2009 | Lin et al. | |
| 2009/0081418 A1 | 3/2009 | Allen et al. | |

* cited by examiner

*Primary Examiner* — Julio J Maldonado
*Assistant Examiner* — Hajar Kolahdouzan
(74) *Attorney, Agent, or Firm* — Connolly Bove Lodge & Hutz LLP

(57) ABSTRACT

An interconnect structure is provided which comprises a semiconductor substrate; a patterned and cured photoresist wherein the photoresist contains a low k dielectric substitutent and contains a fortification layer on its top and sidewall surfaces forming vias or trenches; and a conductive fill material in the vias or trenches. Also provided is a method for fabricating an interconnect structure which comprises depositing a photoresist onto a semiconductor substrate, wherein the photoresist contains a low k dielectric constituent; imagewise exposing the photoresist to actinic radiation; then forming a pattern of vias or trenches in the photoresist; surface fortifying the pattern of vias or trenches proving a fortification layer on the top and sidewalls of the vias or trenches; curing the pattern of vias or trenches thereby converting the photoresist into a dielectric; and filling the vias and trenches with a conductive fill material.

10 Claims, 14 Drawing Sheets

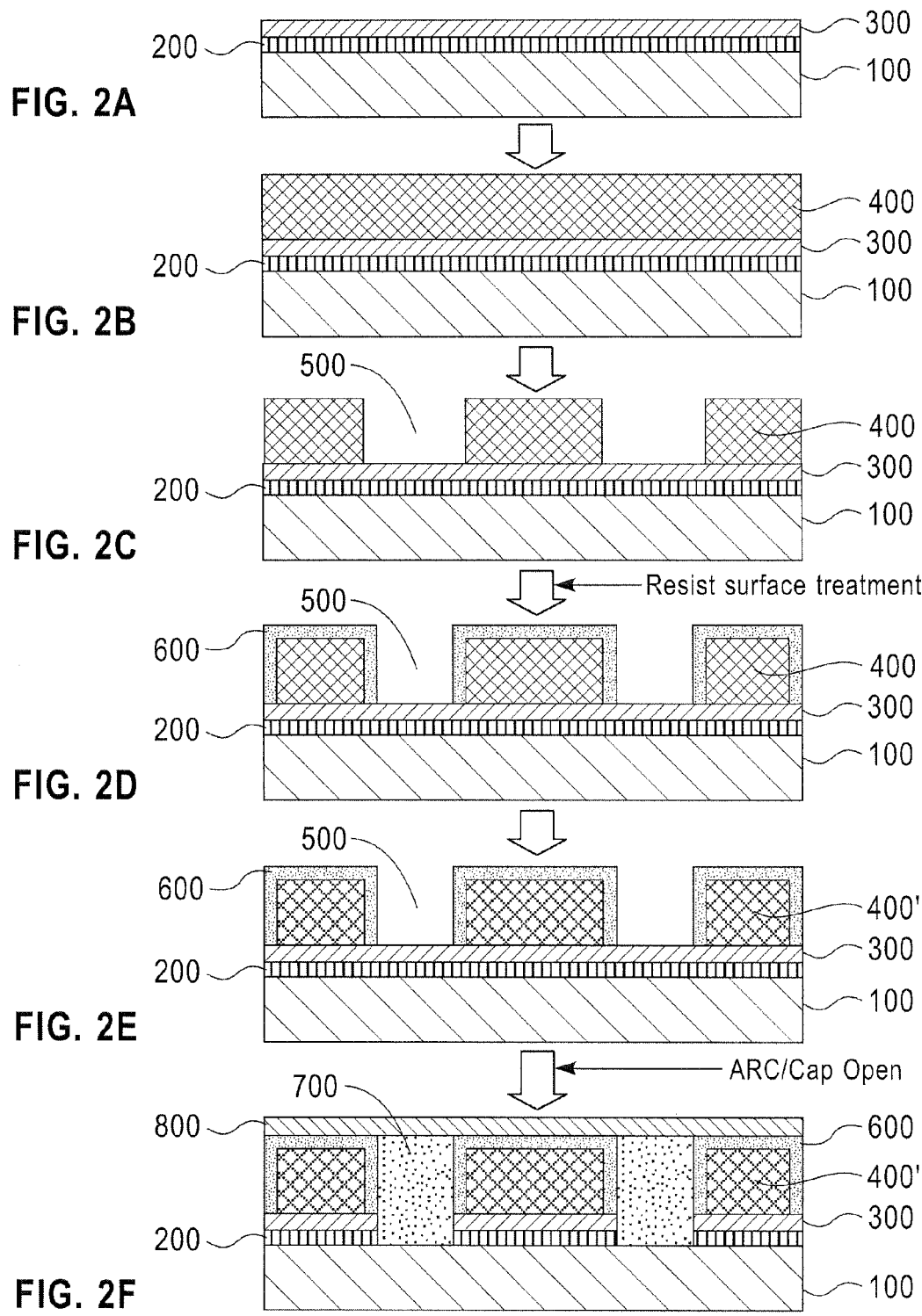

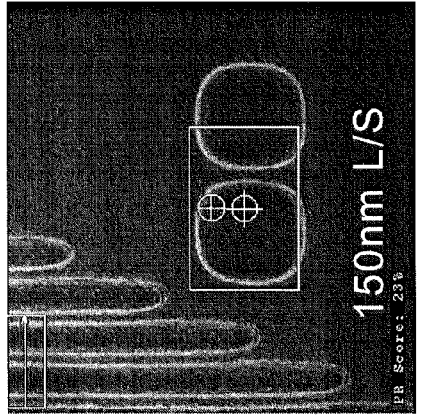
FIG. 3A Post-Litho
FIG. 3B Post Resist Fortification
FIG. 3C Post UV/Thermal Cure
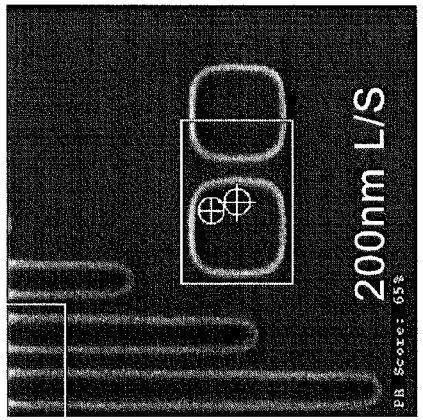
FIG. 3D
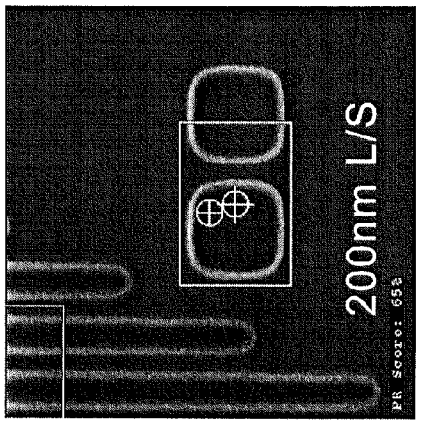
FIG. 3E
FIG. 3F
193 nm ASML 0.72NA, PPLK142 on PPLK ARC, 8.5 mJ, -0.1 µm, (-4,0)

Maintain Patterns After UV/thermal Cure

Reference: Pattern Melt After Cure

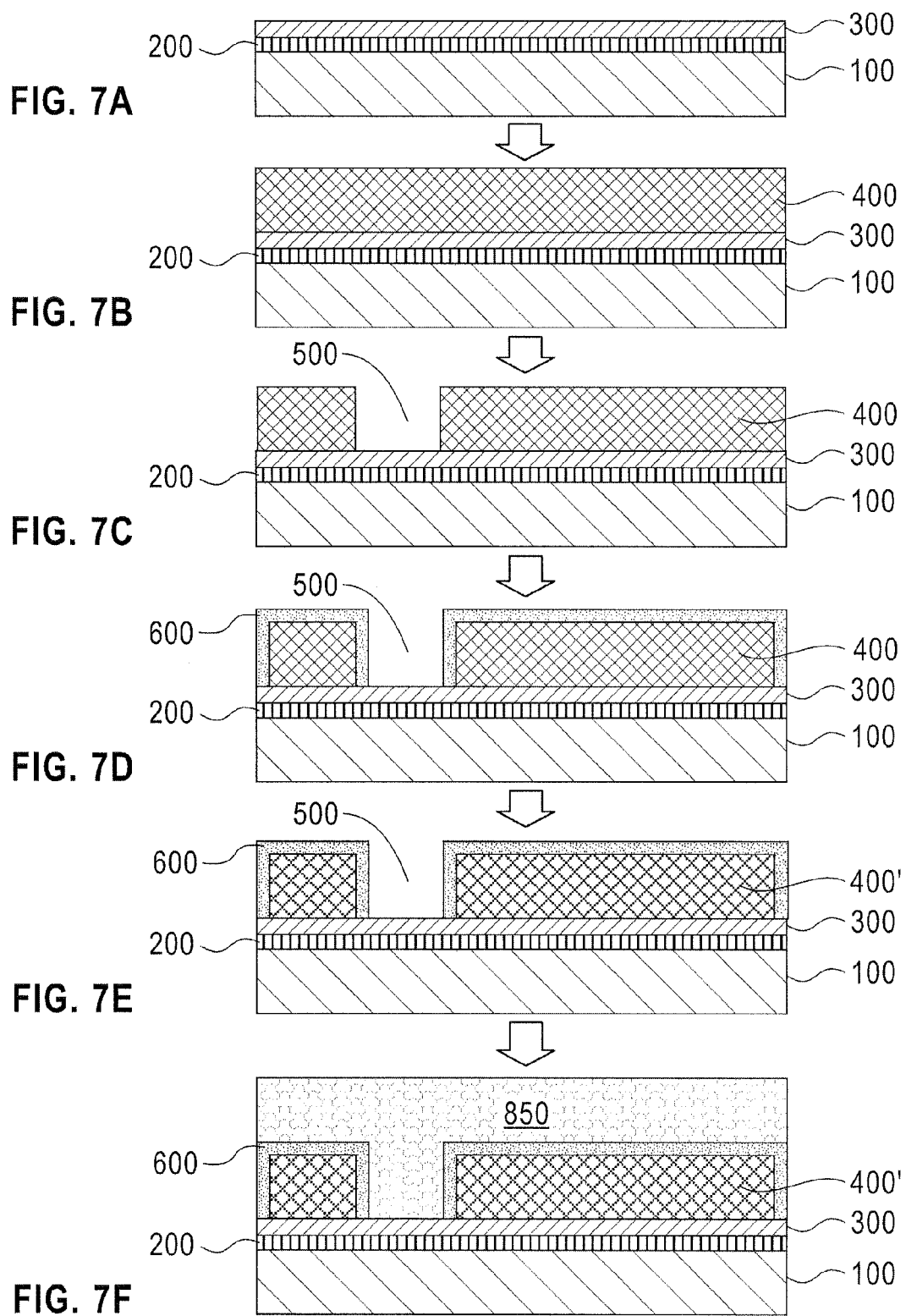

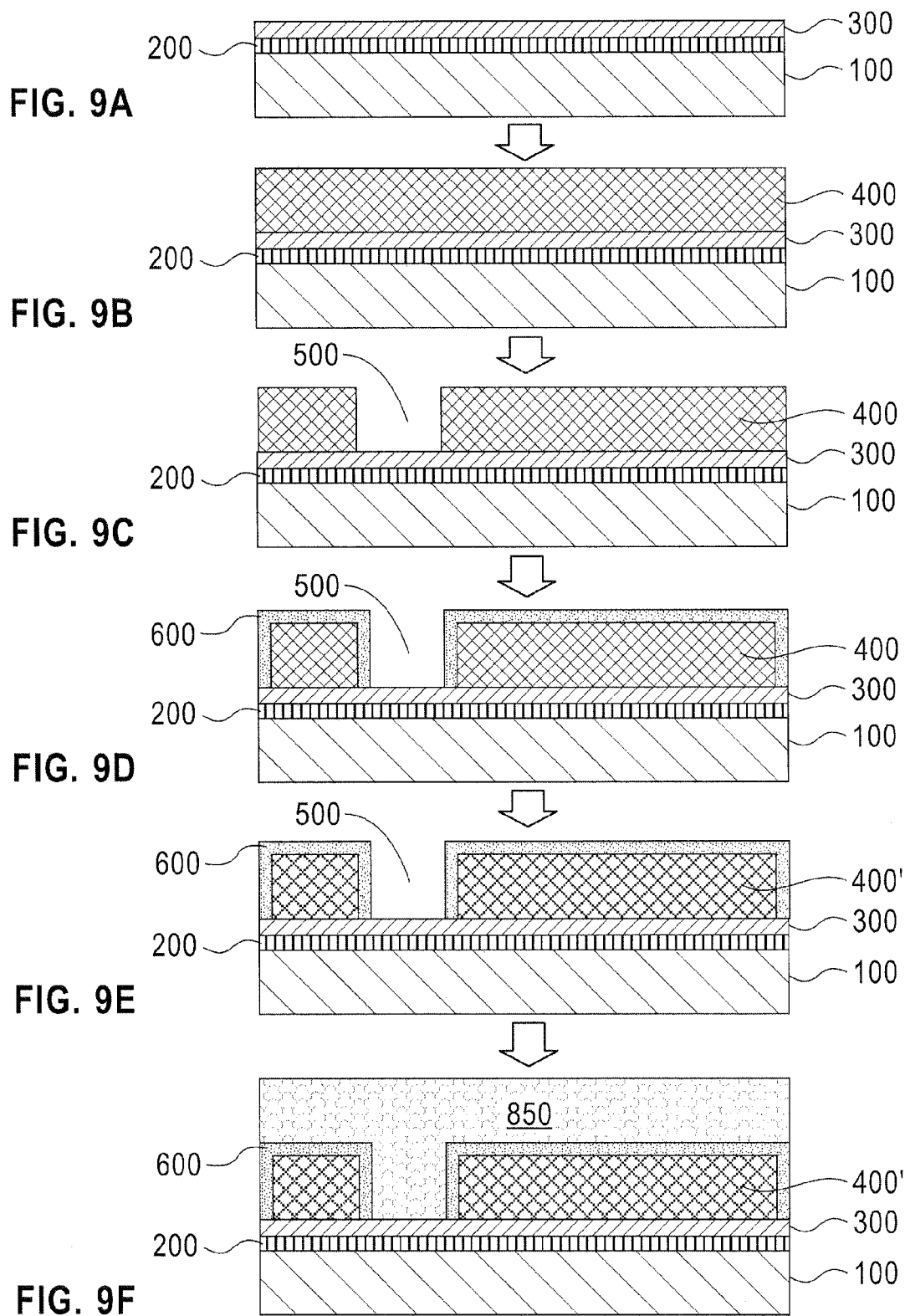

← ARC/Cap Open

INTERCONNECT STRUCTURE AND METHOD OF FABRICATING

TECHNICAL FIELD

The present disclosure relates to semiconductor interconnect structures and methods of fabricating the same. Specifically, the present invention relates to damascene and dual-damascene interconnect structures with patternable low-k dielectrics and methods of fabricating the same.

BACKGROUND

It is widely known that the speed of propagation of interconnect signals is one of the most important factors controlling overall circuit speed as feature sizes are reduced and the number of devices per unit area as well as the number of interconnect levels are increased. Throughout the semiconductor industry, there has been a strong drive to reduce the dielectric constant, k, of the interlayer dielectric (ILD) materials used to electrically insulate metal lines. As a result, interconnect signals travel faster through conductors due to a reduction in resistance-capacitance (RC) delays.

State-of-the-art semiconductor chips employ copper (Cu) as the electrical conductor and inorganic organosilicates as the low dielectric constant (low-k) dielectric, and have up to twelve levels of Cu/low-k interconnect layers. These Cu/low-k interconnect layers are fabricated with an iterative additive process, called dual-damascene, which includes several processing steps including, for example film deposition, patterning by lithography and reactive ion etching, liner (Cu barrier) deposition, Cu metal fill by electrochemical plating, and chemical-mechanical polishing of excessive Cu metal; these steps are described in greater detail in the following paragraphs.

When fabricating integrated circuit wiring within a multi-layer interconnect scheme, an insulating or dielectric material, e.g., silicon oxide or a low-k insulator will normally be patterned with at least several thousand openings to create conductive line openings and/or via openings using photo patterning and plasma etching techniques, e.g., photolithography with a photoresist subsequently followed by etching by plasma processes. These via and line openings are typically filled with a conductive metal material, e.g., aluminum, copper, or their alloys etc., to interconnect the active and/or passive elements of the integrated circuits. The semiconductor device is then polished to level its surface.

A continuous cap layer is then normally deposited over the planarized surface featuring the dielectric material and conductive metal material. Next, a dielectric material is deposited over the continuous cap layer, via and conductive line openings are created again within the dielectric layer as before, another conductive metal material is deposited within the openings and another continuous cap layer is deposited thereon. The process is repeated to fabricate a multi-layer interconnect wiring system. The multi-layer interconnect system built thereby is referred to in the art as a dual-damascene integration scheme.

Unfortunately, the strategy to introduce low-k materials (typically dielectrics whose dielectric constant is below that of silicon oxide) into advanced interconnects is difficult to implement due to the new materials chemistry of the low-k materials that are being introduced. Moreover, low-k materials exhibit fundamentally weaker electrical and mechanical properties as compared to silicon oxide. Further, the low-k dielectric alternatives are typically susceptible to damage during the various interconnect processing steps. The damage observed in the low-k materials is manifested by an increase in the dielectric constant and increased moisture uptake, which may result in reduced performance and device reliability.

Moreover, traditional dual-damascene integration suffers from poor reliability, particularly in porous low-k dielectric materials, due to poor adhesion of the conductor to the dielectric sidewall.

One way to overcome the integration challenges of low-k materials mentioned above is to protect low-k materials by adding at least one sacrificial hardmask layer onto a surface of the low-k material. While the hardmask layer serves to protect the low-k material, the presence of the sacrificial hardmask layer adds enormous process complexity and manufacturing as additional film deposition, pattern transfer etch, and removal of the hardmask layers are needed.

A state-of-the-art back-end-of-the-line (BEOL) integration process, called a low temperature oxide (LTO) process, employs up to eight layers of sacrificial hardmask materials to fabricate a two-layer dual-damascene interconnect structure.

For example, a via-first LTO integration for forming a dual-damascene interconnect includes the steps of: depositing a dielectric material on a substrate including a patterned conductor; forming at least one via in the dielectric material, such that at least one of the vias is positioned over the patterned conductor; depositing a layer of planarizing material on the dielectric material and in the via; depositing a layer of barrier material on the layer of planarizing material; depositing at least one layer of imaging material on the layer of barrier material; forming at least one trench in the imaging material, barrier material and planarizing material, such that the at least one trench is positioned over the via; removing the imaging material, either after or concurrently with forming the trench in the planarizing material; transferring the at least one trench to the dielectric material, such that at least one of the trenches is positioned over the via; removing the barrier material, either after or concurrently with transferring the at least one trench to the dielectric material; and removing the planarizing material.

A line-first LTO integration for forming a dual-damascene interconnect structure includes the steps of: depositing a dielectric material on a substrate including a patterned conductor; forming at least one trench in the dielectric material, such that the at least one trench is positioned over the patterned conductor; depositing a layer of planarizing material on the dielectric material and in the trench; depositing a layer of barrier material on the layer of planarizing material; depositing at least one layer of imaging material on the layer of barrier material; forming at least one via in the imaging material, barrier material and planarizing material, such that at least one of the vias is positioned over the trench and the patterned conductor; removing the imaging material, either after or concurrently with forming the via in the planarizing material; transferring the at least one via to the dielectric material, such that at least one of the vias is positioned over the trench and the patterned conductor; removing the barrier material, either after or concurrently with transferring the at least one via to the dielectric material; and removing the planarizing material.

The prior art dual-damascene integration schemes, such as the LTO one mentioned above, are very complex, inefficient, and costly. For example, the via-first LTO integration scheme requires ten layers of films and twenty-one process steps to form a two-layer dual-damascene dielectric structure. In other words, 80% of the films are not needed in the final interconnect structure.

Although immensely popular in semiconductor manufacturing, the prior art dual-damascene integration scheme described above suffers from several drawbacks including, for example:

(I) First, it constitutes a significant portion of manufacturing cost of advanced semiconductor chips as many layers, up to twelve layers for the state-of-the-art chips, are required to connect the minuscule transistors within a chip and to the printed circuit board.

(II) Second, it is a main yield detractor as the many layers of films required to form the interconnects generate chances for defect introduction and, thus, degrade manufacturing yields.

(III) Third, it is very inefficient and embodies enormous complexity. The current dual-damascene integration scheme requires many sacrificial films (80% of the film stack) to pattern and protect the fragile interlayer dielectric films from damage during processing. These sacrificial patterning and protective films have to be removed after patterning and copper plating.

(IV) Fourth, the performance gain by introduction of new lower-k materials is often offset by the need for higher-k non-sacrificial protective materials, such as a cap layer, a hardmask layer, or a thicker copper barrier layer.

(V) Fifth, the prior art complex dual-damascene process lengthens manufacturing turn-around time and R&D development cycle.

(VI) Sixth, the plasma etching process is an expensive and often unreliable process and requires significant up-front capital investment.

(VII) Seventh, the aforementioned poor adhesion and inclusion of metal into dielectric can cause degradation in performance and reliability of the resultant chips.

More recently, a method has been developed, which is disclosed in U.S. Pat. Nos. 7,306,853 and 7,714,079, assigned to International Business Machines Corporation, disclosure of which is incorporated herein by reference, and which makes it possible to simplify the dual-damascene formation of interconnects, including low-k dielectrics for improved performance, reliability, cost-saving and manufacturing efficiency without mis-alignment between vias and lines.

According to one embodiment of U.S. Pat. Nos. 7,306,853 and 7,714,079, problems in dual-damascene processing are circumvented by combining the functions of a photoresist and a dielectric material into one material. This one material, called a photo-photoresist (or photoresist for short), acts as a photoresist during the lithographic patterning process, and as such, no separate photoresist is required. After lithographic patterning, the photoresist is subsequently converted into a low-k material during a post patterning cure. In this way, plasma etching and the complex sacrificial film stack and processes required for conventional patterning are avoided. The method described herein also avoids the performance and reliability degradation due to via/trench mis-alignment in traditional dual-damascene fabrication.

Although the method disclosed in U.S. Pat. Nos. 7,306,853 and 7,714,079 addresses problems of the prior art, room for improvement still exists.

SUMMARY OF DISCLOSURE

The present disclosure provides a fabrication process that reduces the number of fabrication steps commonly encountered in prior art methods and reduces the costs associated with fabricating interconnect structures and in particular, BEOL (back end of the line) structures. The present makes it possible to reduce plasma induced dielectric damage during damascene fabrication.

In particular, according to one embodiment according to the present disclosure, an interconnect structure is provided that comprises:

a semiconductor substrate;

a patterned and cured photoresist wherein the photoresist contains a low k dielectric substitutent and contains a fortification layer on its top and sidewall surfaces forming vias or trenches; and a conductive fill material in the vias or trenches.

A further aspect of the present disclosure relates to a dual-damascene interconnect structure is provided that comprises:

a semiconductor substrate;

a first patterned and cured photoresist wherein the photoresist contains a low k dielectric element and contains a fortification layer on its top and sidewall surfaces forming vias or trenches;

a second patterned and cured photoresist on top of the first patterned and cured photoresist to thereby form a dual-damascene photoresist interconnect structure, wherein the second photoresist contains a low k dielectric element and contains a fortification layer on its top and sidewall surfaces forming vias or trenches and a conductive fill material in the dual-damascene dielectric interconnect.

Another aspect of the present disclosure relates to a method for fabricating an interconnect structure which comprises:

depositing a photoresist onto a semiconductor substrate, wherein the photoresist contains a low k dielectric substitutent;

imagewise exposing the photoresist to actinic radiation;

then forming a pattern of vias or trenches in the photoresist;

surface fortifying the pattern of vias or trenches proving a fortification layer on the top and sidewalls of the vias or trenches;

curing the pattern of vias or trenches thereby converting the photoresist into a dielectric; and filling the vias and trenches with a conductive fill material.

Yet another aspect of the present disclosure relates to a method for fabricating a dual-damascene interconnect structure which comprises:

depositing a first photoresist onto a semiconductor substrate, wherein the photoresist contains a low k dielectric substitutent;

imagewise exposing the photoresist to actinic radiation;

then forming a first pattern of vias or trenches in the photoresist;

surface fortifying the pattern of vias or trenches proving a fortification layer on the top and sidewalls of the vias or trenches;

curing the pattern of vias or trenches thereby converting the photoresist into a dielectric;

depositing a second photoresist onto a semiconductor substrate, wherein the photoresist contains a low k dielectric substitutent;

imagewise exposing the second photoresist to actinic radiation;

then forming a second pattern of vias or trenches in the photoresist on top of first pattern of vias or trenches to form dual-damascene photoresists interconnect structure;

surface fortifying the pattern of vias or trenches proving a fortification layer on the top and sidewalls of the vias or trenches;

curing the dual-damascene photoresist interconnect thereby converting the photoresist into a dielectric; and filling the dual-damascene dielectric interconnect with a conductive fill material.

In some embodiments, an antireflective coating is formed on the substrate prior to depositing the photoresist. In another embodiment, a material stack comprising a dielectric cap and an antireflective coating is formed on top of the substrate prior to depositing the first photoresist. When such materials are present, a step of forming contact holes through the antireflective coating or material stack may be performed after forming the at least one second interconnect pattern within the second photoresist. The contacts holes enable subsequent contact to the underlying substrate.

A planarization process such as chemical mechanical polishing may follow the step of filling interconnect patterns, i.e., the via and trench patterns, with a conductive material.

In an even further embodiment, a dielectric cap is formed atop the cured second photoresist after filling and planarizing.

The photoresist and all other sacrificial materials and their related deposition, pattern transfer (etch) and removal process used in prior art integration are not needed. In addition, the need for plasma etching steps, which are typically used in prior art patterning processes, are minimized. The reduced use of plasma etching steps reduces plasma-induced dielectric material damage, thus maintaining the performance gain for the introduction of lower dielectric constant on-chip insulators. It is further observed that the method mentioned above reduces the number of layers required to fabricate an interconnect structure and, as such, reduces the time and cost of fabricating interconnect structures as compared to prior art processes. In some embodiments of the disclosure and when an ARC is used, the ARC and the photoresist are part of a permanent dielectric material stack of the interconnect structure.

BRIEF DESCRIPTION OF THE SEVERAL VIEWS OF THE DRAWINGS

FIGS. 2A-2F are pictorial representations (through cross sectional views) depicting the basic processing steps employed in one embodiment for fabricating a single-damascene interconnect structure using patternable dielectrics according to the present disclosure.

FIGS. 3A-3F are electron microphotographs of the structure according to the present disclosure at different stages of the fabrication process.

FIG. 4A is an electron microphotograph of vias prepared according to the present disclosure, while

FIGS. 7A-7J are pictorial representations (through cross sectional views) depicting the basic processing steps employed in one embodiment for fabricating a dual-damascene interconnect structure using patternable dielectrics according to the present disclosure.

FIGS. 9A-9J are pictorial representations (through cross sectional views) depicting the basic processing steps employed in a still further embodiment for fabricating a dual-damascene interconnect structure using patternable dielectrics according to the present disclosure.

DESCRIPTION OF BEST AND VARIOUS EMBODIMENTS

Figure 1:
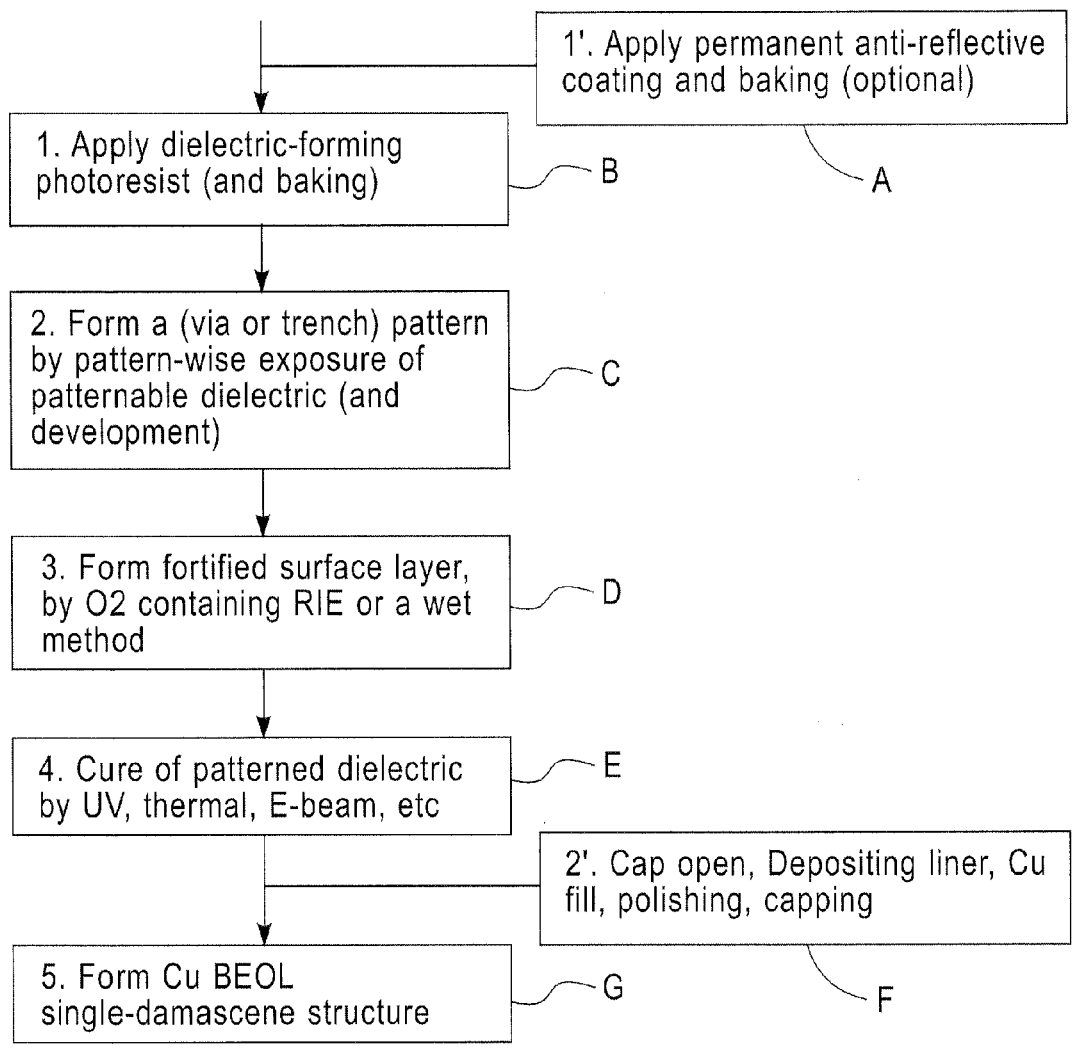
FIGS. 1A-1G illustrate a process flow for a single-damascene process according to the present disclosure.
Figure 4A:
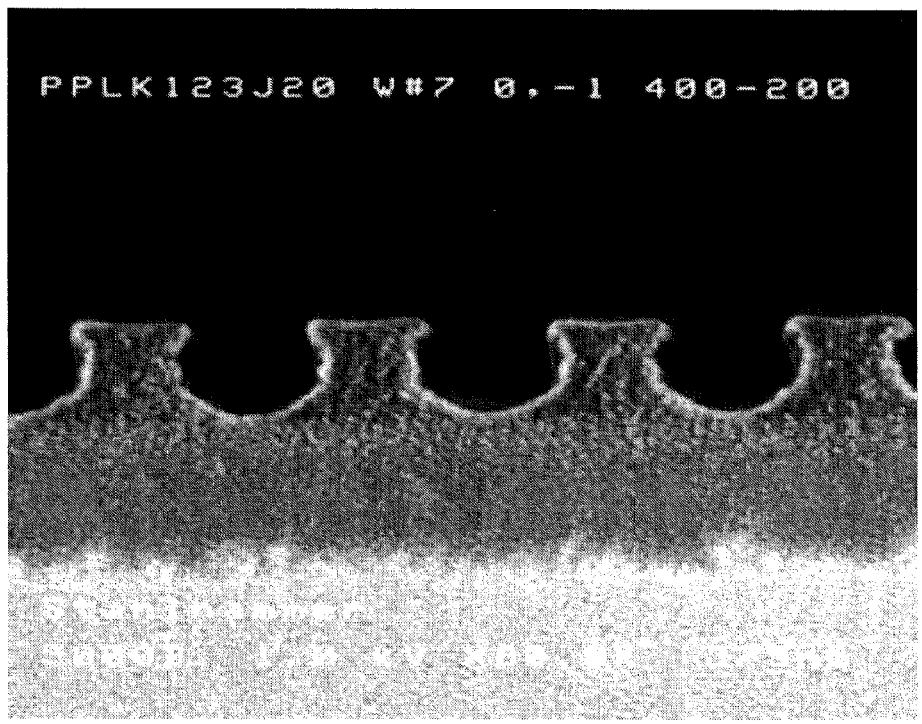
Figure 4B:
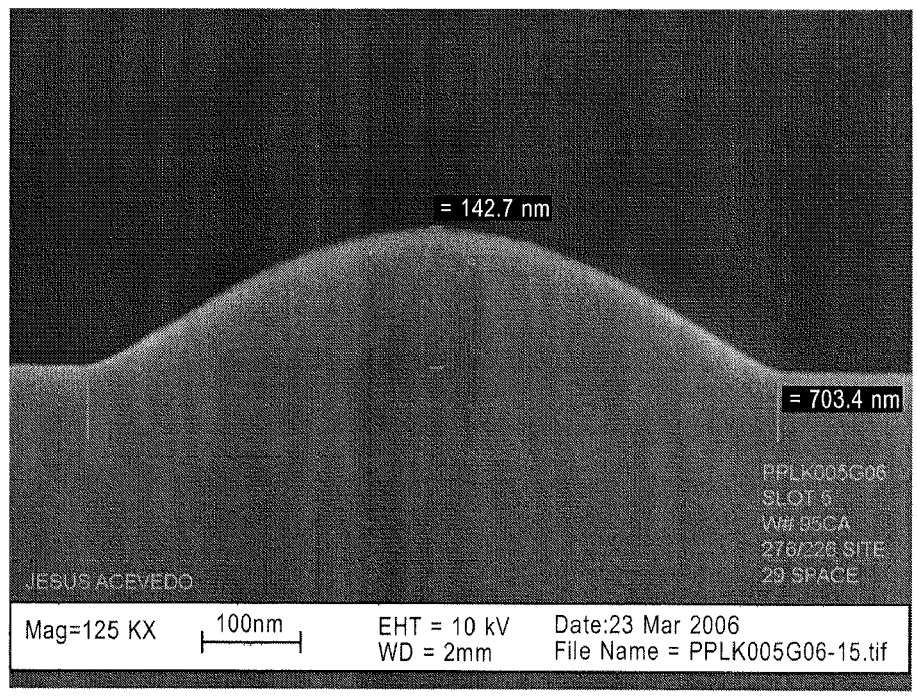
FIG. 4B is an electron microphotograph of vias prepared according to prior disclosure without the resist fortification required by the present disclosure.

The present disclosure, which provides single-and dual-damascene low-k interconnect structures with a positive-tone or a negative-tone patternable dielectric and optionally, an antireflective coating (ARC), and methods of fabricating such interconnect structures, will now be described in greater detail by referring to the following discussion and drawings that accompany the present application. It is noted that the drawings that accompany the present application are provided for illustrative purposes only, and, as such, these drawings are not drawn to scale.

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known materials, structures or processing steps have not been described in detail in order to avoid obscuring the disclosure.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

As mentioned above, the photoresists employed herein are materials that first act as a photoresist during a patterning process and then act as a low-k dielectric insulator after a post patterning cure process. The cured product of a photoresist, therefore, can serve as an on-chip dielectric insulator. The terms "cure" or "curing" are used interchangeable to refer to one of the processes selected from a thermal cure, an electron beam cure, an ultra-violet (UV) cure, an ion beam cure, a plasma cure, a microwave cure or a combination thereof. A "cured" product of a photoresist is the product of the photoresist after it has undergone one of the aforementioned cure processes. The "cured" product of a photoresist is different from the photoresist in chemical nature and physical, mechanical and electrical properties.

As stated above, drawbacks of current typical integration are circumvented herein by combining the functions of a photoresist and a dielectric material into one material. This one material, called a photoresist herein, acts as a photoresist during the lithographic patterning process and, as such a separate photoresist is not required or used herein. After lithographic patterning, the photoresist is surface fortified and subsequently converted into a low-k material with a post patterning cure. In this way, the method disclosed herein reduces plasma induced dielectric damage and the need for plasma etching and the complex sacrificial film stack and processes required for patterning. Moreover, the method disclosed herein also affords profile control.

Reference is now made to FIGS. 1A-1G and FIGS. 2A-2F which illustrate an embodiment of the present invention in which a single-damascene structure is provided using patternable dielectrics as on-chip electrical insulators on a semiconductor chip. In the illustrated embodiment, a material stack including an optional dielectric cap 200 and an optional ARC 300 are shown on substrate 100. Please see FIG. 2A. Although both layers 200 and 300 are shown, the present disclosure also works without either layer present, or with ARC 300 or dielectric cap 200 present only.

FIG. 2A illustrates an initial structure that is utilized in this embodiment. The initial structure includes a substrate 100, an optional dielectric cap 200 located on a surface of substrate 100, and optional antireflective coating 300 located on a surface of the optional dielectric cap 200.

The substrate 100 may comprise an electrically semiconducting material, an insulating material, a conductive material, devices or structures made of these materials or any combination thereof (e.g., a lower level of an interconnect structure). When the substrate 100 is comprised of a semiconducting material, any semiconductor such as Si, SiGe, SiGeC, SiC, Ge alloys, GaAs, InAs, InP and other III/V or II/VI compound semiconductors, or organic semiconductors may be used. The substrate 100 may also be a flexible substrate containing devices that are suitable for high-speed roll-to-roll processing. In addition to these listed types of semiconducting materials, substrate 100 may also be a layered semiconductor such as, for example, Si/SiGe, Si/SiC, silicon-on-insulators (SOIs) or silicon germanium-on-insulators (SGOIs). These semiconductor materials may form a device, or devices or structures, which may be discrete or interconnected. These devices and device structures may be for computation, transmission, storage or display of information, such as logic devices, memory devices, switches or display devices.

When the substrate 100 is an electrically insulating material, the insulating material can be an organic insulator, an inorganic insulator or a combination thereof including multilayers. The substrate 100 may also include a patternable low-k dielectric material as well. These electrically insulating materials may be part of a device, or devices or structures, which may be discrete or interconnected. These devices and structures may be for logic applications or memory applications. When the substrate 100 is an electrically conducting material, the substrate may include, for example, polySi, an elemental metal, an alloy including at least one elemental metal, a metal silicide, a metal nitride or combinations thereof including multilayers. When the substrate 100 comprises a semiconducting material, one or more semiconductor devices such as, for example, complementary metal oxide semiconductor (CMOS) devices, strained silicon devices, carbon-based (carbon nanotubes and/or graphene) devices, phase-change memory devices, magnetic memory devices, magnetic spin switching devices, single electron transistors, quantum devices, molecule-based switches and other switching or memory devices that can be part of an integrated circuit, can be fabricated thereon.

The optional dielectric cap 200 is formed directly on the surface of substrate 100 utilizing a conventional deposition process such as, for example, chemical vapor deposition (CVD), plasma enhanced chemical vapor deposition (PECVD), atomic layer deposition (ALD), chemical solution deposition (such as spin coating), or evaporation. The dielectric cap 200 comprises any suitable dielectric capping material such as, for example, SiC, SiN, $SiO_2$, a carbon doped oxide, a nitrogen and hydrogen doped silicon carbide SiC(N, H) or multilayers thereof. Dielectric cap 200 may be a continuous layer or a discontinuous layer. Dielectric cap 200 may also be a layer with graded composition in the vertical direction, or dielectric cap 200 may be a select cap, such as CoWP.

After the deposition of the dielectric cap 200 a post deposition treatment may be applied to modify the properties of either the entire layer or the surface of the dielectric cap 200. This post deposition treatment can be selected from heat treatment, irradiation of electromagnetic wave (such as of ultra-violet light), particle beam (such as an electron beam, or an ion beam), plasma treatment, chemical treatment through a gas phase or a liquid phase (such as application of a monolayer of surface modifier) or any combination thereof. This post-deposition treatment can be blanket or pattern-wise. The post deposition treatment enhances the chemical, physical, electrical, and/or mechanical properties of the dielectric cap 200, such as adhesion strength. The chemical properties include nature and/or location of surface functional groups, and hydrophilicity. The physical properties include density, moisture absorption, and heat conductivity. The mechanical properties include modulus, hardness, cohesive strength, toughness, resistance to crack and adhesion strength to its neighboring layers. The electrical properties include dielectric constant, electrical breakdown field, and leakage current.

The heat treatment should be no high than the temperature that the underlying substrate can withstand, usually 500° C. This heat treatment can be conducted in an inert environment or within a chemical environment in a gas phase or a liquid phase. This treatment step may or may not be performed in the same tool as that used in forming the dielectric cap 200.

The post deposition treatment by irradiation of electromagnetic wave can be by ultra-violet (UV) light, microwave and the like. The UV light can be broadband with a wavelength range from 100 nm to 1000 nm. It can also be UV light generated by an excimer laser or other UV light source. The UV treatment dose can be a few $mJ/cm^2$ to thousands of $J/cm^2$. This irradiation treatment can be conducted at ambient temperature or at an elevated temperature no higher than 500° C. This irradiation treatment can be conducted in an inert environment or within a chemical environment in a gas phase or a liquid phase. The following conditions may be employed in some embodiments of the present invention: a radiation time from 10 sec to 30 min, a temperature from room temperature to 500° C., and an environment including vacuum, or gases such as, for example, inert gas, $N_2$, $H_2$, $O_2$, $NH_3$, hydrocarbon, and $SiH_4$. This treatment step may or may not be performed in the same tool as that used in forming the dielectric cap 200.

The post deposition treatment by plasma treatment can be selected from oxidizing plasma, reducing plasma or a neutral plasma. Oxidizing plasmas include, for example, $O_2$, CO, and $CO_2$. Reducing plasmas include, for example, $H_2$, $N_2$, $NH_3$, and $SiH_4$. The neutral plasmas include, for example, Ar and He. A plasma treatment time from 1 sec to 10 min and a plasma treatment temperature from room temperature to 400° C. can be employed. This treatment step may or may not be performed in the same tool as that used in forming the dielectric cap 200.

The post deposition chemical treatment may be conducted in a gas phase or a liquid phase. In one embodiment, the following conditions may be employed: a treatment time from 1 sec to 30 min, a temperature from room temperature (i.e., from 20° C. to 30° C.) to 500° C. Chemicals suitable for this chemical treatment may be selected from any chemicals that improve chemical, physical, electrical, and/or mechanical properties of the dielectric cap layer, such as adhesion strength. This chemical treatment may penetrate the entire layer of dielectric cap 200 or is limited only to the surface of the dielectric cap 200. Example chemicals include adhesion promoters such as silanes, siloxanes and silylation agents. This treatment step may or may not be performed in the same tool as that used in forming the dielectric cap 200.

The thickness of the dielectric cap 200 may vary depending on the technique used to form the same as well as the material make-up of the layer. Typically, the dielectric cap 200 has a thickness from 2 nm to 55 nm, with a thickness from 10 nm to 45 nm being more typical.

Next, an optional antireflective coating (ARC) 300 is formed on a surface of the optional dielectric cap 200, if present, or directly on a surface of the substrate 100 when the dielectric cap 200 is not present. In one embodiment, the ARC 300 is included within the structure. ARC 300 may be a single layer, multilayer or a graded layer with a composition that varies along the vertical direction.

The ARC 300 employed has the following general characteristics: (i) It acts as an antireflective coating (ARC) during a lithographic patterning process; (ii) It withstands high-temperature BEOL integration processing (up to 500° C.); (iii) It prevents resist (e.g., the photoresist) poisoning by the substrate; (iv) It provides vertical wall profile and sufficient etch selectivity between the photoresist and the ARC layer; (v) It serves as a permanent dielectric layer in a chip (low dielectric constant, typically k<5, more typically k<3.6); and (vi) It is compatible with conventional BEOL integration and produces reliable hardware.

Further discussion is now provided for characteristics (i)-(v).

Characteristic (i) ARC 300 acts as an antireflective coating (ARC) during a lithographic patterning process: ARC 300 may be designed to control reflection of light that is transmitted through the photoresist (to be subsequently formed), reflected off the substrate 100 and back into the photoresist, where it can interfere with incoming light and cause the photoresist to be unevenly exposed. The ARC's optical constants are defined here as the index of refraction n and the extinction coefficient k. In general, ARC 300 can be modeled so as to find optimum optical parameters (n and k values) of the ARC as well as optimum thickness. The typical optical constants of ARC 300 are in the range from n=1.2 to n=3.0 and k=0.01 to k=0.9, preferably n=1.4 to n=2.6 and k=0.02 to k=0.78 at a wavelength of 365, 248, 193 and 157, 126 nm and extreme ultraviolet (13.4 nm) radiation. The optical properties and thickness of ARC 300 are optimized to obtain optimal resolution, profile control and to maximize process window of the photoresist during the subsequent patterning steps, which is well known to those ordinarily skilled in the art.

Characteristic (ii) ARC 300 can withstand high-temperature BEOL integration processing (up to 500° C.): ARC 300 must withstand the harsh processing conditions during BEOL integration. These include high temperature and intense UV cure. The process temperature can be as high as 450° C. The intensity of the light used in the UV cure process can be as high as tens of J/cm$^2$.

Characteristic (iii) ARC 300 prevents resist (e.g., photoresist) poisoning by the substrate: The photoresists employed herein are preferably chemically amplified resists. They can be poisoned by any basic containment from the underlying substrate. ARC 300 must serve as a barrier layer to prevent basic contaminant from the underlying substrate from diffusing into the photoresist to poison the chemically amplified photoresist.

Characteristic (iv) ARC 300 provides vertical wall profile and sufficient etch selectivity between the photoresist and the ARC layer: ARC 300 should provide sufficient reflectivity control with reflectivity from the underlying substrate under a particular lithographic wavelength of less than 8%, preferably less than 5%, more preferably less than 2% and generate vertical side wafer profile. ARC 300 should also generate residue-free patterns with no footing. Moreover, the adhesion of the photoresist should be sufficient to prevent pattern collapse during patterning and the subsequent UV cure. ARC 300 should also be designed such that the etch selectivity during a subsequent ARC/cap open process is sufficiently high so that the opening of the ARC/cap stack does not erode a significant portion of the photoresist and degrade significantly its pattern profile. An etch selectivity (etch rate ratio of ARC/cap versus photoresist) is greater than 1, preferably greater than 3, more preferable greater than 5.

Characteristic (v) ARC 300 serves as a permanent dielectric layer in a chip: ARC 300 remains after patterning and cure of the photoresist. It serves as a permanent dielectric layer in a chip. Therefore, ARC 300 (after cure) must meet the requirements of an on-chip dielectric insulator, including electrical properties (low dielectric constant: preferably k less than 5, and more preferably k less than 3.6; dielectric breakdown field: greater than 2 MV/cm, preferably greater than 4 MV/cm, and more preferably greater than 6 MV/cm, leakage: less than $10^{-5}$ A/cm$^2$, preferably less than $10^{-7}$ A/cm$^2$, and more preferably less than $10^{-9}$ A/cm$^2$); mechanical properties (adhesion energy is equal to or greater than the cohesive energy of the weakest layer of the integrated film stack); must pass electrical and mechanical reliability tests.

The thickness of the ARC 300 may vary depending on the technique used to form the same as well as the material make-up of the layer. Typically, the ARC 300 has a thickness from 5 nm to 200 nm, with a thickness from 20 nm to 140 nm being more typical. ARC 300 may be either organic, inorganic or a combination thereof.

Antireflective coatings are well known to those skilled in the art and include, for example, organic homopolymers or copolymers of polyesters, polyimides, polyacrylates, polymethacrylates, polysulfones, and amorphous carbon that satisfy all of the characteristics of ARC 300 mentioned above. The ARC 300 may be applied by spin-on techniques, spray on techniques, dipping, etc. Inorganic antireflective coatings, such as silicon oxynitride (SiON), silicon carbide (SiC), silicon oxycarbide (SiOC), SiCOH, siloxane, silane, carbosilane, oxycarbosilane, and silsesquioxane, either as a polymer or a copolymer may also be employed and may be deposited, for example, by plasma-enhanced chemical vapor deposition, spin-on techniques, dipping, etc. When ARC 300 is a multilayer ARC, the deposition of each layer may be the same or a combination of deposition methods can be used. After applying ARC 300, particularly those from a liquid phase, a post deposition baking step is usually required to remove unwanted components, such as solvent, and to effect crosslinking The post deposition baking step of ARC 300 is typically, but not necessarily always, performed at a temperature from 80° C. to 300° C., with a baking temperature from 120° C. to 200° C. being even more typical.

Examples of ARC materials that can be employed in the present disclosure as ARC 300 include, but are not limited to those disclosed within U.S. Ser. No. 11/858,636, filed Sep. 20, 2007, now U.S. Patent Application Publication No. 2009/

0079076, and U.S. Ser. No. 11/858,615, filed Sep. 20, 2007, now U.S. Patent Application Publication No. 2009/0081418. The entire contents of each of the aforementioned ARC materials are incorporated herein by reference in their entirety.

In some embodiments, the as-deposited ARC 300 may be subjected to a post deposition treatment to improve the properties of the entire layer or the surface of ARC 300. This post deposition treatment can be selected from heat treatment, irradiation of electromagnetic wave (such as ultra-violet light), particle beam (such as an electron beam, or an ion beam), plasma treatment, chemical treatment through a gas phase or a liquid phase (such as application of a monolayer of surface modifier) or any combination thereof. This post-deposition treatment can be blanket or pattern-wise. The post deposition treatment enhances the chemical, physical, electrical, and/or mechanical properties of the ARC 300 and/or the film stack containing ARC 300, such as adhesion strength. The chemical properties include nature and/or location of surface functional groups, and hydrophilicity. The physical properties include density, moisture absorption, and heat conductivity. The mechanical properties include modulus, hardness, cohesive strength, toughness, resistance to crack and adhesion strength to its neighboring layers. The electrical properties include dielectric constant, electrical breakdown field, and leakage current.

The heat treatment should be no higher than the temperature that the underlying substrate can withstand, usually 500° C. This heat treatment can be conducted in an inert environment or within a chemical environment in a gas phase or a liquid phase. This treatment step may or may not be performed in the same tool as that used in forming ARC 300.

The post deposition treatment by irradiation of electromagnetic wave can be by ultra-violet (UV) light, microwave and the like. The UV light can be broadband with a wavelength range from 100 nm to 1000 nm. It can also be UV light generated by an excimer laser or other UV light source. The UV treatment dose can be a few mJ/cm$^2$ to thousands of J/cm$^2$. This irradiation treatment can be conducted at ambient temperature or at an elevated temperature no higher than 500° C. This irradiation treatment can be conducted in an inert environment or within a chemical environment in a gas phase or a liquid phase. In one embodiment, the following conditions may be employed: a radiation time from 10 sec to 30 min, a temperature from room temperature to 500° C., and an environment including vacuum, or gases such as, for example, inert gas, $N_2$, $H_2$, $O_2$, $NH_3$, hydrocarbon, and $SiH_4$. This treatment step may or may not be performed in the same tool as that used in forming the ARC 300.

The post deposition treatment by plasma treatment can be selected from oxidizing plasma, reducing plasma or a neutral plasma. Oxidizing plasmas include, for example, $O_2$, CO, and $CO_2$. Reducing plasmas include, for example, $H_2$, $N_2$, $NH_3$, and $SiH_4$. The neutral plasmas include, for example, Ar and He. A plasma treatment time from 1 sec to 10 min and a plasma treatment temperature from room temperature to 400° C. can be employed. This treatment step may or may not be performed in the same tool as that used in forming the ARC 300.

The post deposition chemical treatment may be conducted in a gas phase or a liquid phase. In one embodiment, the following conditions may be employed: a treatment time from 1 sec to 30 min, a temperature from room temperature to 500° C. Chemicals suitable for this chemical treatment may be selected from any chemicals that improve chemical, physical, electrical, and/or mechanical properties of ARC 300 and/or the film stack containing ARC 300, such as adhesion strength. This chemical treatment may penetrate the entire layer of ARC 300 or is limited only to the surface of the ARC 300. Example chemicals include adhesion promoters such as, for example, silanes, siloxanes, and silylation agents. This treatment step may or may not be performed in the same tool as that used in forming the ARC 300.

Examples of such post deposition treatments are disclosed, for example, in U.S. Ser. No. 11/626,550, filed Jan. 24, 2007, now U.S. Patent Application Publication No. 2008/0173984, the entire content which is incorporated herein by reference.

Next, and as illustrated in FIG. 2B, a photoresist 400, which combines the function of a photoresist and low-k material into one single material is provided. In the embodiment illustrated, the photoresist 400 is provided on the surface of the ARC 300. In other embodiments, the photoresist 400 can be provided directly on the dielectric cap 200 (when no ARC 300 is present) or directly on the surface of substrate 100 (when neither ARC 300 nor dielectric cap 200 is present).

The photoresist 400 is provided (i.e., formed) utilizing a conventional deposition process including, for example, spin-on-coating, dip coating, brush coating, and ink-jet dispensing. After applying the photoresist 400, a post deposition baking step is typically, but not necessarily always, required to remove unwanted components, such as solvent. When performed, the baking step is conducted at a temperature from 40° C. to 200° C., with a baking temperature from 60° C. to 140° C. being even more preferred. The duration of the baking step varies from 10 seconds to 600 seconds and is not critical herein.

The thickness of the photoresist 400 may vary depending on the requirement of the chip and the technique used to form the same as well as the material make-up of the layer. Typically, the photoresist 400 has a thickness from 1 nm to 50,000 nm, with a thickness from 20 nm to 5000 nm being more typical.

As stated above, the photoresist 400 functions as a photoresist and is converted into a low-k material during post patterning processing, by heat, UV light, electron beam, ion beam, microwave, plasma cure, thermal cure or combinations thereof. For instance, the first photoresist 400 may comprise a functionalized polymer, copolymer, or a blend including at least two of any combination of polymers and/or copolymers having one or more acid-sensitive imageable groups. These polymers, copolymers or blends can be converted into low-k dielectric material after subsequent processing. It is noted that when the photoresist 400 is a polymer, it includes at least one monomer (to be described in greater detail below). When the photoresist 400 is a copolymer, it includes at least two monomers (to be described in greater detail below). The blends of polymers and/or copolymers include at least two of any combination of polymers and/or copolymers described below.

In general terms, the photoresist that can be employed as layer 400 comprises a polymer, a copolymer, or a blend including at least two of any combination of polymers and/or copolymers, wherein the polymers include one monomer and the copolymers include at least two monomers and wherein the monomers of the polymers and the monomers of the copolymers are selected from a siloxane, silane, carbosilane, oxycarbosilane, silsesquioxane, alkyltrialkoxysilane, tetraalkoxysilane, unsaturated alkyl substituted silsesquioxane, unsaturated alkyl substituted siloxane, unsaturated alkyl substituted silane, an unsaturated alkyl substituted carbosilane, unsaturated alkyl substituted oxycarbosilane, carbosilane substituted silsesquioxane, carbosilane substituted siloxane, carbosilane substituted silane, carbosilane substituted carbosilane, carbosilane substituted oxycarbosilane, oxycarbosilane substituted silsesquioxane, oxycarbosilane substituted siloxane, oxycarbosilane substituted silane, oxycarbosilane substituted carbosilane, and oxycarbosilane substituted oxycarbosilane.

More specifically, the photoresist 400 comprises a photo/acid-sensitive polymer of one monomer or a copolymer of at least two monomers selected from hydrocarbons, fluorinated hydrocarbons, siloxane, silane, carbosilane, oxycarbosilane, organosilicates, silsesquioxanes and the like. The photoresist 400 may also comprise a polymer of one monomer or a copolymer of at least two monomers selected from alkyltri-alkoxysilane, tetra-alkoxysilane, unsaturated alkyl (such as vinyl) substituted silsesquioxane, unsaturated alkyl substituted siloxane, unsaturated alkyl substituted silane, an unsaturated alkyl substituted carbosilane, unsaturated alkyl substituted oxycarbosilane, carbosilane substituted silsesquioxane, carbosilane substituted siloxane, carbosilane substituted silane, carbosilane substituted carbosilane, carbosilane substituted oxycarbosilane, oxycarbosilane substituted silsesquioxane, oxycarbosilane substituted siloxane, oxycarbosilane substituted silane, oxycarbosilane substituted carbosilane, and oxycarbosilane substituted oxycarbosilane. Additionally, the patternable low-k dielectric material 400 may comprise a blend including at least two of any combination of polymers and/or copolymers, wherein the polymers include one monomer and the copolymers include at least two monomers and wherein the monomers of the polymers and the monomers of the copolymers are selected from a siloxane, silane, carbosilane, oxycarbosilane, silsesquioxane, alkyltri-alkoxysilane, tetra-alkoxysilane, unsaturated alkyl substituted silsesquioxane, unsaturated alkyl substituted siloxane, unsaturated alkyl substituted silane, an unsaturated alkyl substituted carbosilane, unsaturated alkyl substituted oxycarbosilane, carbosilane substituted silsesquioxane, carbosilane substituted siloxane, carbosilane substituted silane, carbosilane substituted carbosilane, carbosilane substituted oxycarbosilane, oxycarbosilane substituted silsesquioxane, oxycarbosilane substituted siloxane, oxycarbosilane substituted silane, oxycarbosilane substituted carbosilane, and oxycarbosilane substituted oxycarbosilane.

Optionally the photoresist 400 may comprise at least one microscopic pore generator (porogen). The pore generator may be or may not be photo/acid sensitive. By "photo/acid sensitive": it means that this porogen is sensitive to light and/or acid such that the porogen itself is patternable or enhances the resolution and/or the pattern quality of the photoresist. This pore generator has these attributes: (1) is compatible with the other components of the patternable low-k composition, i.e., without phase separation after coating and other processing; (2) can be patterned with standard lithographic techniques as part of the patternable low-k composition; and (3) can be removed during the post patterning cure process to generate microscopic pores, thus lowering the dielectric constant of the cured photoresist. The pore size (diameter) should be less than 10 nm, preferably less than 5 nm, and more preferably less than 2 nm.

Illustrative polymers for the photoresist 400 include, but are not limited to, siloxane, silane, carbosilane, oxycarbosilane, silsesquioxanes -type polymers including caged, linear, branched or combinations thereof. In one embodiment, the first patternable dielectric material 400 comprises a blend of these photo/acid-sensitive polymers. Examples of photoresists usable with the present disclosure are disclosed in U.S. Pat. Nos. 7,041,748, 7,056,840, and 6,087,064, as well as U.S. Ser. No. 11/750,356, filed May 18, 2007, now U.S. Patent Application Publication No. 2008/0286467, Ser. No. 12/047,435, filed Mar. 13, 2008, and Ser. No. 12/126,287, filed May 23, 2008 all of which are incorporated herein by reference in their entirety. The dielectric constant of the photoresist 400 after cure is generally no more than 4.3. The dielectric constant may be greater than 1 and up to 4.3, more preferably from 1 to 3.6, even more preferably from 1 to 3.0, further more preferably from 1 to 2.5, with from 1 to 2.0 being most preferred.

The photoresist 400 is formed from a composition that includes one of the above mentioned polymers, copolymers or blends, a photoacid generator, a base additive and a solvent typically used in a photoresists. When the photoresist 400 is a negative-tone photoresist, it may be formed from a composition optionally including an additional cross-linker. This additional cross-linker can be a small compound (as compared with a polymer or copolymer) or a polymer, a copolymer, or a blend including at least two of any combination of polymers and/or copolymers, wherein the polymers include one monomer and the copolymers include at least two monomers and wherein the monomers of the polymers and the monomers of the copolymers are selected from a siloxane, silane, carbosilane, oxycarbosilane, silsesquioxane, alkyltri-alkoxysilane, tetra-alkoxysilane, unsaturated alkyl substituted silsesquioxane, unsaturated alkyl substituted siloxane, unsaturated alkyl substituted silane, an unsaturated alkyl substituted carbosilane, unsaturated alkyl substituted oxycarbosilane, carbosilane substituted silsesquioxane, carbosilane substituted siloxane, carbosilane substituted silane, carbosilane substituted carbosilane, carbosilane substituted oxycarbosilane, oxycarbosilane substituted silsesquioxane, oxycarbosilane substituted siloxane, oxycarbosilane substituted silane, oxycarbosilane substituted carbosilane, and oxycarbosilane substituted oxycarbosilane.

When the photoresist 400 is a positive-tone photoresist, it is formed from a composition that includes one of the above mentioned polymers, copolymers or blends, a photoacid generator, a base additive and a solvent typically used in a photoresists. The photoacid generators, base additives and solvents are well known to those skilled in the art and, as such, details regarding those components are not fully provided.

In a typical embodiment, the photoresist 400 is a chemically amplified positive-tone or negative-tone photoresist that comprises a silsesquioxane polymer or copolymer or a blend of at least two of any combination of polymers and/or copolymers. This photo/acid sensitive silsesquioxane polymer or copolymer may undergo a photo/acid catalyzed chemical transformation to form circuit patterns after lithographic patterning. When the photoresist 400 is a chemically amplified positive-tone photoresist, it typically undergoes a de-protection reaction to render the exposed area soluble in a developer; when the photoresist 400 is a chemically amplified negative-tone photoresist, it typically undergoes a cross-linking reaction (to itself or through an additional cross-linker) to render it insoluble in a developer in the exposed regions during lithographic processing. Therefore, integrated circuit patterns can be generated during standard semiconductor lithography process. Furthermore, these integrated circuit patterns maintain their pattern integrity during the post patterning cure process to convert the photoresist from a resist into a low-k material. Examples of such photo/acid sensitive silsesquioxane polymers or copolymers include poly(methylsilsesquioxane) (PMS), poly(p-hydroxybenzylsilsesquioxane) (PHBS), poly(p-hydroxyphenylethylsilsesquioxane) (PHPES), poly(p-hydroxyphenylethylsilsesquioxane-co-p-hydroxy-alpha-methylbenzyl silsesquioxane) (PHPE/HMBS), poly(p-hydroxyphenylethylsilsesquioxane-co-methoxybenzylsilsesquioxane) (PHPE/MBS), poly(p-hydroxyphenylethylsilsesquioxane-co-t-butylsilsesquioxane) (PHPE/BS), poly(p- hydroxyphenylethylsilsesquioxane-co-cyclohexylsilsesquioxane) (PHPE/CHS), poly(p-hydroxyphenylethylsilsesquioxane-co-phenylsilsesquioxane) (PHPE/PS), poly(p-hydroxyphenylethylsilsesquioxane-co-bicycloheptylsilsesquioxane) (PHPE/BHS), polyp-hydroxy-alpha-methylbenzylsilsesquioxane) (PHMBS), polyp-hydroxy-alpha-methylbenzylsilsesquioxane-co-p-hydroxybenzylsilsesquioxane) (PHMB/HBS), poly(p-hydroxy-alpha-methylbenzylsilsesquioxane-co-methoxybenzylsilsesquioxane) (PHMB/MBS), poly(p-hydroxy-alpha-methylbenzylsilsesquioxane-co-t-butylsilsesquioxane) (PHMB/BS), poly(p-hydroxy-alpha-methylbenzylsilsesquioxane-co-cyclohexylsilsesquioxane) (PHMB/CHS), poly(p-hydroxy-alpha-methylbenzylsilsesquioxane-co-phenylsilsesquioxane) (PHMB/PS), poly(p-hydroxy-alpha-methylbenzylsilsesquioxane-co-bicycloheptylsilsesquioxane) (PHMB/BHS), poly(p-hydroxybenzylsilsesquioxane-co-p-hydroxyphenylethylsilsesquioxane) (PHB/HPES), and poly (p-hydroxy-alpha-methylbenzylsilsesquioxane-co-p-alpha-methylbenzylsilsesquioxane) (PHMB/MBS). In one embodiment, the patternable low-k dielectric material 400 is a copolymer of at least two monomers selected from an alkyltrialkoxysilane and/or a tetra-alkoxysilane. Preferred copolymers are derived from at least two monomers selected from methyltrimethoxysilane, methyltriethoxysilane, ethyltrimethoxysilane, or ethyltriethoxysilane, as the alkyltrialkoxysilane monomer and tetra-methoxysilane or tetra-ethoxysilane, as the tetra-alkoxysilane monomer.

In another embodiment, the patternable low-k dielectric material 400 comprises a polymer of one monomer or a copolymer of at least two monomers selected from alkyltrialkoxysilane, tetra-alkoxysilane, unsaturated alkyl (such as vinyl) substituted silsesquioxane, unsaturated alkyl substituted siloxane, unsaturated alkyl substituted silane, an unsaturated alkyl substituted carbosilane, unsaturated alkyl substituted oxycarbosilane, carbosilane substituted silsesquioxane, carbosilane substituted siloxane, carbosilane substituted silane, carbosilane substituted carbosilane, carbosilane substituted oxycarbosilane, oxycarbosilane substituted silsesquioxane, oxycarbosilane substituted siloxane, oxycarbosilane substituted silane, oxycarbosilane substituted carbosilane, and oxycarbosilane substituted oxycarbosilane.

In one embodiment, the photoresist 18 comprises a silsesquioxane polymer. It may be linear, branched, caged compound or combinations thereof having the following general structural formula:

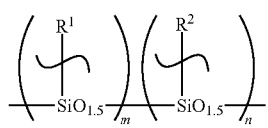

where, m and n represent the number of repeating units, $R^1$ represents a group which may comprise one or more functional groups which may provide polymer solubility in an aqueous base and provide functional groups for cross-linking, and $R^2$ represents a group which may comprise a carbon functionality which may control polymer dissolution rate in an aqueous base. Subscripts m and n may be integers in the range from 0 to 5000, such as 1 to 5000 for example. $R^1$ may not be the same as $R^2$.

$R^1$ is not limited to any specific functional group, and may comprise functional groups which are substituted with —OH groups, —C(O)OH groups, —F, or combinations thereof. $R^1$ may comprise linear or branched alkyls, cycloalkyls, aromatics, arenes, or acrylics. For example, $R^1$ may be:

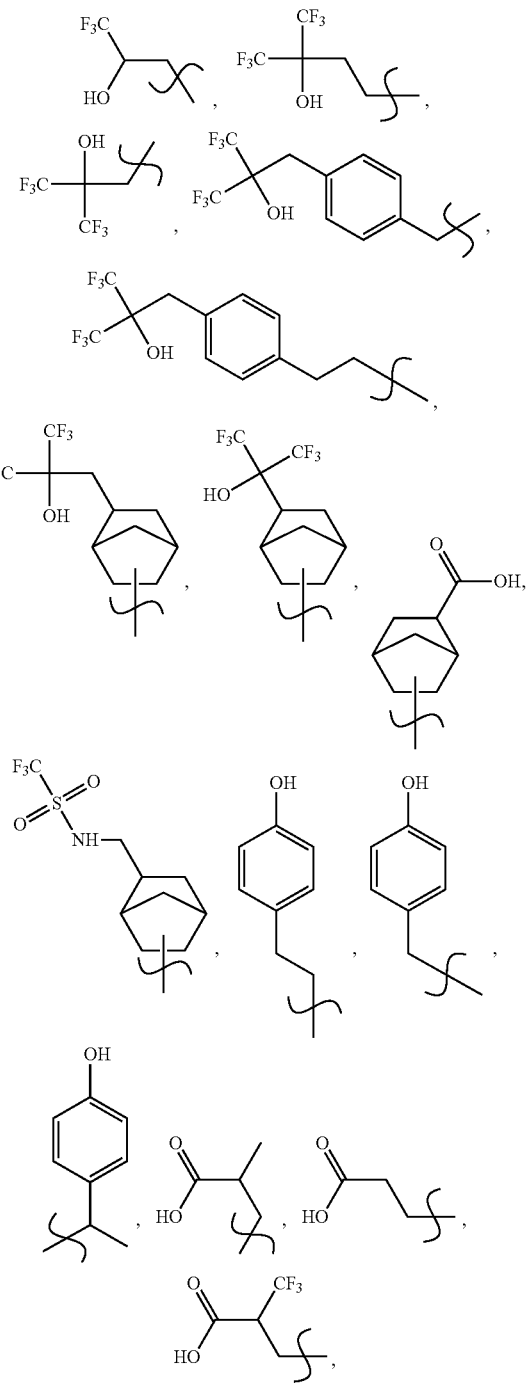

or the like.

$R^2$ is not necessarily limited to any specific functional group, and may comprise hydrogen, or linear or branched alkyls, cylcoalkyls, aromatics, arenes, acrylates, or combinations thereof. For example $R^2$ may be:

H,

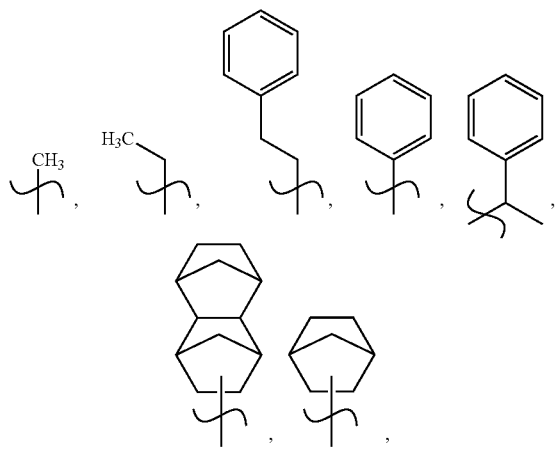

or the like.

The $R^1$ and $R^2$ proportions and structures may be selected to provide a material suitable for photolithographic patterning processes.

In one embodiment, the patternable low-k dielectric material 400 is a negative-tone patternable low-k dielectric material comprising a blend including at least two of any combination of polymers and/or copolymers, wherein the polymers include one monomer and the copolymers include at least two monomers and wherein the monomers of the polymers and the monomers of the copolymers are selected from a siloxane, silane, carbosilane, oxycarbosilane, silsesquioxane, alkyltrialkoxysilane, tetra-alkoxysilane, unsaturated alkyl substituted silsesquioxane, unsaturated alkyl substituted siloxane, unsaturated alkyl substituted silane, an unsaturated alkyl substituted carbosilane, unsaturated alkyl substituted oxycarbosilane, carbosilane substituted silsesquioxane, carbosilane substituted siloxane, carbosilane substituted silane, carbosilane substituted carbosilane, carbosilane substituted oxycarbosilane, oxycarbosilane substituted silsesquioxane, oxycarbosilane substituted siloxane, oxycarbosilane substituted silane, oxycarbosilane substituted carbosilane, and oxycarbosilane substituted oxycarbosilane. The polymers in the blend may be miscible with each other. The first polymer or copolymer of the polymer blend has been described above.

In some instances, the second polymer of the polymer blend of this embodiment may comprise a polymer of one monomer or a copolymer including at least two monomers and wherein the monomers of the polymers and the monomers of the copolymers are selected from a siloxane, silane, carbosilane, oxycarbosilane, silsesquioxane, alkyltrialkoxysilane, tetra-alkoxysilane, unsaturated alkyl substituted silsesquioxane, unsaturated alkyl substituted siloxane, unsaturated alkyl substituted silane, an unsaturated alkyl substituted carbosilane, unsaturated alkyl substituted oxycarbosilane, carbosilane substituted silsesquioxane, carbosilane substituted siloxane, carbosilane substituted silane, carbosilane substituted carbosilane, carbosilane substituted oxycarbosilane, oxycarbosilane substituted silsesquioxane, oxycarbosilane substituted siloxane, oxycarbosilane substituted silane, oxycarbosilane substituted carbosilane, and oxycarbosilane substituted oxycarbosilane. In another embodiment, the second polymer of the polymer blend may comprise a copolymer at least two monomers selected from siloxane, silane, silsesquioxane, carbosilane, or oxycarbosilane moieties. In another embodiment of the present invention, the second polymer of the polymer blend may comprise a copolymer of at least two monomers selected from an alkyltrialkoxysilane and/or a tetra-alkoxysilane. The molar ratio of the alkyltrialkoxysilane monomer in the copolymer ranges from 0 to 100%. The weight average molecular weight of the copolymer range from 100-5,000,000 g/mol, preferably 500-50,000 g/mol. Preferred copolymers are derived from at least two monomers selected from methyltrimethoxysilane, methyltriethoxysilane, ethyltrimethoxysilane, or ethyltriethoxysilane, as the alkyltrialkoxysilane monomer and tetra-methoxysilane or tetra-ethoxysilane, as the tetra-alkoxysilane monomer. In one embodiment, the second polymer of the polymer blend is a copolymer of methylsilsesquioxane and tetra-alkoxysilane.

In another embodiment, the second polymer of the polymer blend is a silsesquioxane polymer comprising a polymer having the structural formula:

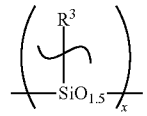

wherein $R^3$ may be a functional group comprising alkyls, cycloalkyls, aryl, or combinations thereof, and wherein x represents the number of repeating units and may be an integer in a range from 4 to 50000. For example, $R^3$ may be:

H,

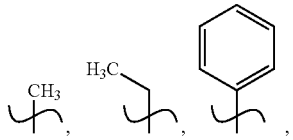

or the like.

In one embodiment, the polysilsesquioxane may be poly(methylsilsesquioxane), where $R^3$ is a methyl group, and x is an integer from 10 to 1,000. In other embodiments, x may be greater than 1,000. The polysilsesquioxane may also comprise a copolymer with siloxane, silane, carbosilane, oxycarbosilane, alkyltrialkoxysilane, or tetra-alkoxysilane. The polysilsesquioxane structure may be caged, linear, branched, or a combination thereof. The silsesquioxane polymers described herein may comprise end groups comprising silanols, halosilanes, acetoxysilanes, silylamines, alkoxysilanes, or combinations thereof, which may undergo condensation reactions in the presence of an acid (such as an acid generated by a photoacid generator under exposure to radiation), followed by thermal baking. Polymer molecules of the polysilsesquioxane may undergo chemical crosslinking with the first polymer or copolymer of the polymer blend, the second polysilsesquioxane polymer or copolymer in the polymer blend itself, or a combination of these.

In one embodiment, the polysilsesquioxane may be the silsesquioxane copolymer LKD-2056 or LKD2064 (products of JSR Corporation) which contains silanol end groups. Such crosslinking may be not limited to silanols, but may also include halosilanes, acetoxysilanes, silylamines, and alkoxysilanes. The silsesquioxane polymers described herein may undergo chemical crosslinking, including photoacid-catalyzed crosslinking, thermally induced crosslinking, or a combination of these, such as condensation reactions of silanol end groups, for example.

The second silsesquioxane polymers or copolymers in the polymer blend may have a weight averaged molecular weight in the range from 200 to 5,000,000 g/mol, such as from 1500 to 10,000 g/mol, for example.

In another embodiment, the patternable low-k dielectric material 400 is a negative-tone photoresist comprising a carbosilane-substituted silsesquioxane polymer that may be a linear, branched, caged compound or a combination thereof, having the following general structural formula:

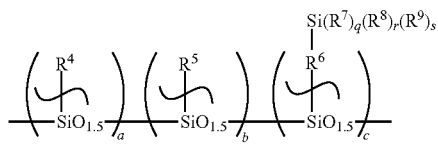

where, a, b, and c represent the number of each of the repeating units, $R^4, R^5, R^6, R^7$, and $R^8$ are carbon-containing groups, and $R^9$ is an alkoxy group. $R^6$, $R^7$ and $R^8$ may each independently represent a hydrocarbon group comprising 1 to 6 carbon atoms.

$R^4$, $R^5$, $R^6$, $R^7$, $R^8$, $R^9$ may be non-identical groups. Subscripts a, b, and c represent the number of repeating units in the polymer chain. Subscripts q and r may be integers in a range from 0 to 3. Subscript s may be an integer in a range from 1 to 3. Subscripts a and c may be integers greater than zero. For example a and c may each independently be in a range from 1 to 5,000. Subscript b may be an integer greater than or equal to zero. For example, b may be an integer in a range from 0 to 5,000.

$R^4$ may represent a group which comprises one or more functional groups which provide polymer solubility in an aqueous base and functional groups for a cross-linking reaction. Each instance of $R^4$ is not limited to any specific functional group, and may comprise a functional group which is substituted with one or more —OH groups, —C(O)OH groups, —F, or combinations thereof. $R^4$ may comprise linear or branched alkyls, cycloalkyls, aromatics, arenes, or acrylics. Examples of $R^4$ include:

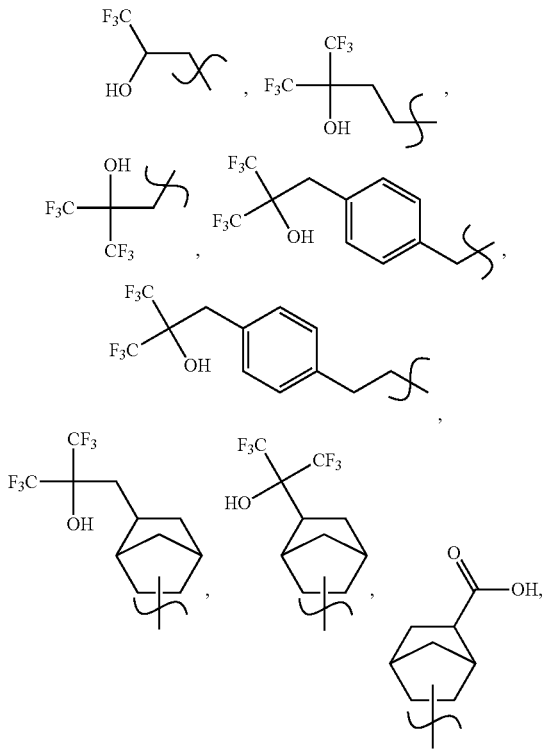

or the like.

$R^5$ may represent a group which comprises a carbon functionality comprising at least one carbon atom, where the carbon functionality controls polymer dissolution of the polymer into an aqueous base. The structure (e.g., size, chain length, etc.) of $R^5$ may affect the dissolution rate of the polymer into an aqueous base. Balancing of the dissolution-controlling group, $R^5$, with the solubility and cross-linking controlling group, $R^4$, allows properties such as dissolution rate and aqueous base solubility to be appropriately adjusted. $R^5$ is not necessarily limited to any specific functional group, and may comprise linear or branched alkyls, cylcoalkyls, aromatics, arenes, acrylates, or combinations thereof. Examples of $R^5$ include:

H,

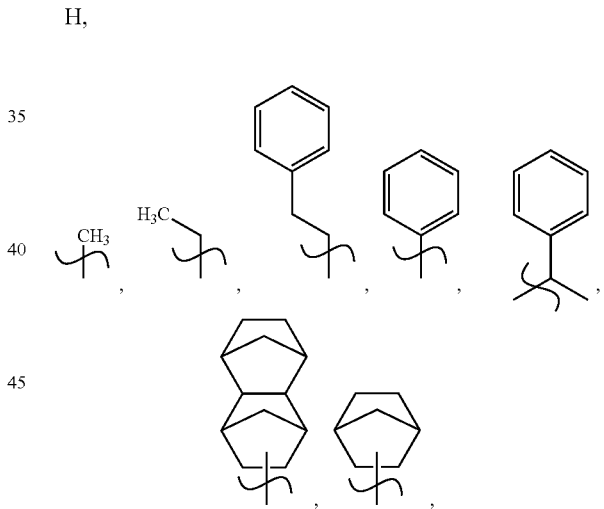

or the like.

$R^6$ is not limited to any specific alkoxy group. Examples of $R^6$ include linear or branched alkoxys, cycloalkoxy, and acetoxy groups.

The specific proportions and structures of $R^4$, $R^5$, and $R^6$ may be selected to provide a material suitable for photolithographic patterning processes.

In another embodiment, the photoresist 400 is a negative-tone photoresist comprising a polymer blend of a first polymer or copolymer and a second polymer or copolymer wherein the first polymer is the carbosilane-substituted silsesquioxane polymer described above and the second polymer is polymer of one monomer or a copolymer of at least two monomers selected from siloxane, silane, silsesquioxane, carbosilane, or oxycarbosilane moieties. In one embodiment of the present invention, the second polymer of the polymer blend may comprise a copolymer of at least two monomers selected from an alkyltrialkoxysilane and/or a tetra-alkoxysilane. The molar ratio of the alkyltrialkoxysilane monomer in the copolymer ranges from 0 to 100%. The weight average molecular weight of the copolymer range from 100-5,000,000 g/mol, preferably 500-50,000 g/mol. Preferred copolymers are derived from at least two monomers selected from methyltrimethoxysilane, methyltriethoxysilane, ethyltrimethoxysilane, or ethyltriethoxysilane, as the alkyltrialkoxysilane monomer and tetra-methoxysilane or tetra-ethoxysilane, as the tetra-alkoxysilane monomer. In one embodiment, the second polymer of the polymer blend is a copolymer of methylsilsesquioxane and tetra-alkoxysilane.

In another embodiment, the negative-tone carbosilane-substituted silsesquioxane patternable low-k composition may be a polymer blend of a first polymer and a second polymer wherein the first polymer is the carbosilane-substituted silsesquioxane polymer described above and the second polymer of the polymer blend is a silsesquioxane polymer comprising a polymer having the structural formula:

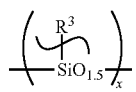

wherein $R^3$ may be a functional group comprising alkyls, cycloalkyls, aryl, or combinations thereof, and wherein x represents the number of repeating units and may be an integer in a range from 4 to 50000. For example, $R^3$ may be:
H,

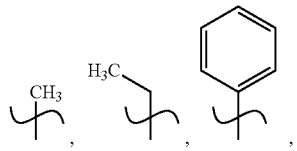

or the like.

In one embodiment, the polysilsesquioxane may be poly(methylsilsesquioxane), where $R^3$ is a methyl group, and x is an integer from 10 to 1,000. In other embodiments, x may be greater than 1,000. The polysilsesquioxane may also comprise a copolymer with siloxane, silane, carbosilane, oxycarbosilane, alkyltrialkoxysilane, or tetra-alkoxysilane. The polysilsesquioxane structure may be caged, linear, branched, or a combination thereof. The silsesquioxane polymers or copolymers described herein may comprise end groups comprising silanols, halosilanes, acetoxysilanes, silylamines, alkoxysilanes, or combinations thereof, which may undergo condensation reactions in the presence of an acid (such as an acid generated by a photoacid generator under exposure to radiation), followed by thermal baking. Polymer molecules of the polysilsesquioxane may undergo chemical crosslinking with the first polymer or copolymer of the polymer blend, the second polysilsesquioxane polymer or copolymer in the polymer blend itself, or a combination of these. In one embodiment, the polysilsesquioxane may be the silsesquioxane copolymer LKD-2056 or LKD2064 (products of JSR Corporation) which contains silanol end groups. Such crosslinking may be not limited to silanols, but may also include halosilanes, acetoxysilanes, silylamines, and alkoxysilanes. The silsesquioxane polymers described herein may undergo chemical crosslinking, including photoacid-catalyzed crosslinking, thermally induced crosslinking, or a combination of these, such as condensation reactions of silanol end groups, for example.

The silsesquioxane polymers representing the second polymer of the polymer blend described for this embodiment may have a weight averaged molecular weight in the range from 200 grams/mole (g/mol) to 500,000 g/mol, such as from 1500 g/mol to 10,000 g/mol, for example.

In another embodiment, compositions containing a blend of at least two of any combination of a silsesquioxane polymer and/or a silsesquioxane copolymer are employed. The silsesquioxane polymer or copolymer in the blend may be selected from the silsesquioxane polymers or copolymers described above or may be selected from other silsesquioxane polymers or copolymers such as, for example, poly(methylsilsesquioxane) (PMS), poly(p-hydroxybenzylsilsesquioxane) (PHBS), poly(p-hydroxybenzylsilsesquioxane-co-methoxybenzylsilsesquioxane) (PHB/MBS), polyphydroxy-alpha-methylbenzylsilsesquioxane-co-p-alpha-methylbenzylsilsesquioxane) (PHMB/MBS), poly(p-hydroxybenzylsilsesquioxane-co-t-butylsilsesquioxane) (PHB/BS), poly(p-hydroxybenzylsilsesquioxane-co-cyclohexylsilsesquioxane) (PHB/CHS), poly(p-hydroxybenzylsilsesquioxane-co-phenylsilsesquioxane) (PHB/PS), poly(p-hydroxybenzylsilsesquioxane-co-bicycloheptylsilsesquioxane) (PHB/BHS), and caged silsesquioxanes such as octakis(glycidyloxypropyl)dimethylsilyloxy)silsesquioxane, octakis[cyclohexenyl epoxide)dimethylsilyloxy]silsesquioxane, octakis[4-(hydroxyphenylethyl)dimethylsilyloxy]silsesquioxane, and octakis[{2-(1',1'-bis(trifluoromethyl)-1'-hydroxyethyl)norbornyl}dimethylsilyloxy]silsesquioxane. If desired, a combination of different Si-containing polymers may be used in the blend with the non-Si-containing polymers, such as a pore generator.

In yet another embodiment, the patternable low-k dielectric material 400 comprises a copolymer of at least two monomers selected from an alkyltrialkoxysilane and/or a tetra-alkoxysilane. Preferred copolymers are derived from at least two monomers selected from methyltrimethoxysilane, methyltriethoxysilane, ethyltrimethoxysilane, or ethyltriethoxysilane, as the alkyltrialkoxysilane monomer and tetra-methoxysilane or tetra-ethoxysilane, as the tetra-alkoxysilane monomer.

In a preferred embodiment for negative-tone photoresists two miscible, or compatible, silsesquioxanes are employed. The first silsesquioxane polymer or copolymer is a linear, branched, caged compound or combination thereof having the following structural formula:

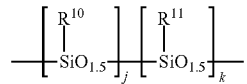

wherein each occurrence of $R^{10}$ is one or more acidic functional groups for base solubility and provides functional groups for cross-linking; each occurrence of $R^{11}$ is a carbon functionality for controlling polymer dissolution rate in an aqueous base; $R^{10}$ is not equal to $R^{11}$; j and k represent the number of repeating units; j is an integer; and k is zero or an integer greater than zero.

In the present disclosure, $R^{10}$ is not limited to any specific functional group, and is preferably selected from among linear or branched alkyls which are substituted with OH, C(O)OH, and/or F; cycloalkyls which are substituted with OH, C(O)OH, and/or F; aromatics which are substituted with OH, C(O)OH, and/or F; arenes that are substituted with OH, C(O)OH, and/or F; and acrylics which are substituted with OH, C(O)OH, and/or F. Examples of preferred $R^{10}$ include:

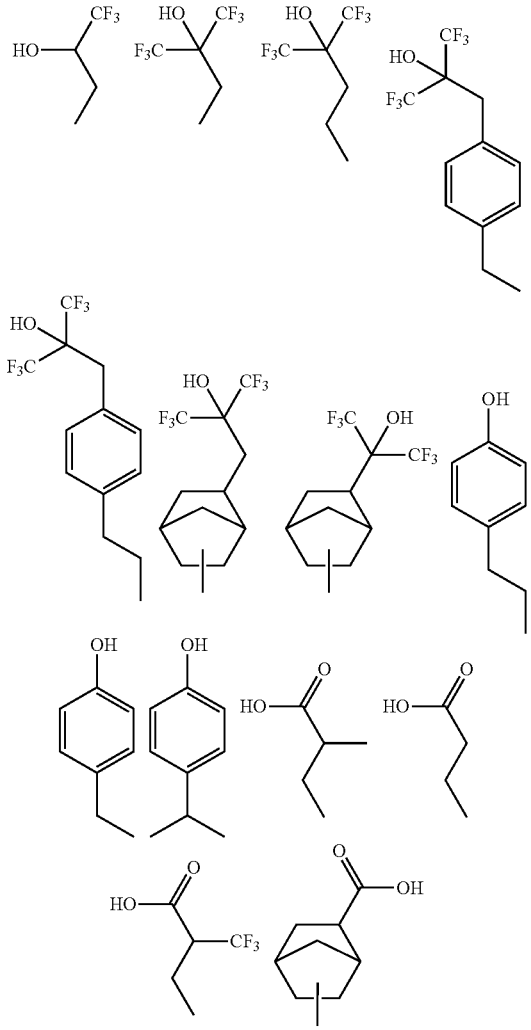

In the present disclosure, $R^{11}$ is not limited to any specific carbon functional group, and is preferably selected from among linear or branched alkyls, cylcoalkyls, aromatics, arenes, and acrylates.

The silsesquioxane polymers or copolymers of this embodiment have a weight averaged molecular weight of 400 to 500,000, and more preferable from 1500 to 10,000. The $R^{10}$ and $R^{11}$ proportions and structures are selected to provide a material suitable for photolithographic processes.

A second polymer component of the blend material includes but is not limited to a family of organosilicates known as silsesquioxanes having the structural formula:

wherein $R^3$ may be a functional group comprising alkyls, cycloalkyls, aryl, or combinations thereof, and wherein x represents the number of repeating units and may be an integer in a range from 4 to 50000. For example, $R^3$ may be:

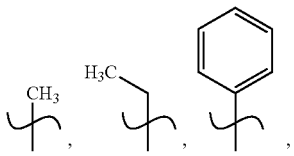

or the like.

In one embodiment, the polysilsesquioxane may be poly(methylsilsesquioxane), where $R^3$ is a methyl group, and x is an integer from 10 to 1,000. In other embodiments, x may be greater than 1,000. The polysilsesquioxane may also comprise a copolymer with siloxane, silane, carbosilane, oxycarbosilane, alkyltrialkoxysilane, or tetra-alkoxysilane. The polysilsesquioxane structure may be caged, linear, branched, or a combination thereof. The silsesquioxane polymers or copolymers described herein may comprise end groups comprising silanols, halosilanes, acetoxysilanes, silylamines, alkoxysilanes, or combinations thereof, which may undergo condensation reactions in the presence of an acid (such as an acid generated by a photoacid generator under exposure to radiation), followed by thermal baking. Polymer molecules of the polysilsesquioxane may undergo chemical crosslinking with the first polymer or copolymer of the polymer blend, the second polysilsesquioxane polymer or copolymer in the polymer blend itself, or a combination of these. In one embodiment, the polysilsesquioxane may be the silsesquioxane copolymer LKD-2056 or LKD2064 (products of JSR Corporation) which contains silanol end groups. Such crosslinking may be not limited to silanols, but may also include halosilanes, acetoxysilanes, silylamines, and alkoxysilanes. The silsesquioxane polymers described herein may undergo chemical crosslinking, including photoacid-catalyzed crosslinking, thermally induced crosslinking, or a combination of these, such as condensation reactions of silanol end groups, for example.

A third component of a negative-tone patternable low-k composition is a photosensitive acid generator (PAG). Examples of preferred PAGs include: -(trifluoro-methylsulfonyloxy)-bicyclo[2.2.1]hept-5-ene-2,3-dicarboximide (MDT), onium salts, aromatic diazonium salts, sulfonium salts, diaryliodonium salts, and sulfonic acid esters of N-hydroxyamides or -imides, as disclosed in U.S. Pat. No. 4,371,605. The content of the '605 patent is incorporated herein by reference. A weaker acid generated from a PAG such as N-hydroxy-naphthalimide (DDSN) may be used. Combinations of PAGs may be used.

The composition of the silsesquioxane polymers or copolymers in the blend formulation is 1 to 99% of the total polymer composition. In a preferred embodiment, the composition of the acid sensitive polymer is 20 to 80% of the total polymer composition, and even more preferred, 30 to 60%.

Condensation in the presence of an acid generated by a photoacid generator under exposure to radiation is not limited to silanols, but may also include halosilanes, acetoxysilanes, silylamines, and alkoxysilanes. Organic crosslinking agents, such as methylphenyltetramethoxymethyl glycouril (methylphenyl powderlink), may also be included in the formulation. Although photoacid generators are preferred for crosslinking, photobase generators can also be used for crosslinking silanol polymers or copolymers.

The photoresist 400 also typically includes a casting solvent to dissolve the other components. Examples of suitable casting solvent include but are not limited to ethoxyethylpropionate (EEP), a combination of EEP and γ-butyrolactone, propylene-glycol monomethylether alcohol and acetate, propyleneglycol monopropyl alcohol and acetate, and ethyl lactate. Combinations of these solvents may also be used.

In optimizing the photolithography process, an organic base may be added to the formulation. The base employed in the present invention may be any suitable base known in the resist art. Examples of bases include tetraalkylammonium hydroxides, cetyltrimethylammonium hydroxide, and 1,8-diaminonaphthalene. The compositions are not limited to any specific selection of base.

In yet another embodiment, the photoresist 400 is a chemically amplified positive-tone photoresist comprising a silicon-containing polymer. The silicon-containing polymer employed may be a homopolymer or a copolymer. Suitable types of such silicon-containing polymers include a polymer, a copolymer, a blend including at least two of any combination of polymers and/or copolymers, wherein said polymers include one monomer and said copolymers include at least two monomers and wherein said monomers of said polymers and said monomers of said copolymers are selected from a siloxane, silane, carbosilane, oxycarbosilane, silsesquioxane, alkyltrialkoxysilane, tetra-alkoxysilane, unsaturated alkyl substituted silsesquioxane, unsaturated alkyl substituted siloxane, unsaturated alkyl substituted silane, an unsaturated alkyl substituted carbosilane, unsaturated alkyl substituted oxycarbosilane, carbosilane substituted silsesquioxane, carbosilane substituted siloxane, carbosilane substituted silane, carbosilane substituted carbosilane, carbosilane substituted oxycarbosilane, oxycarbosilane substituted silsesquioxane, oxycarbosilane substituted siloxane, oxycarbosilane substituted silane, oxycarbosilane substituted carbosilane, and oxycarbosilane substituted oxycarbosilane. Highly preferred silicon-backbone polymers are selected from the group consisting of poly(hydroxyphenyl alkyl)silsesquioxanes and poly(hydroxyphenyl alkyl)siloxanes, wherein the alkyl is a $C_{1-30}$ moiety. These preferred silicon-containing polymers are preferably fully or partially protected with acid-sensitive protecting groups.

Where the silicon-containing polymeric additive contains a silicon-containing substituent bonded to the polymeric backbone, the silicon-containing polymeric additive may be a homopolymer or copolymer containing at least one monomer having a silicon-containing substituent. The silicon-containing substituent may or may not be acid sensitive. Typically, however the substituent is acid sensitive when containing a $C_2$ alkyl moiety. Preferably, the silicon-containing substituent is attached to a monomer selected from the group consisting of hydroxystyrene, an acrylate, a methacrylate, an acrylamide, a methacrylamide, itaconate, an itaconic half ester or a cycloolefin. Preferred silicon-containing substituents include: siloxane, silane and cubic silsesquioxanes. The silicon-containing polymer may further include silicon-free monomers such as those selected from the group consisting of styrene, hydroxystyrene, acrylic acid, methacrylic acid, itaconic acid and an anhydride such as maleic anhydride and itaconic anhydride.

Preferred monomers containing silicon-containing substituents are trimethylsilyl alkyl acrylate, trimethylsilyl alkyl methacrylate, trimethylsilyl alkyl itaconate, tris(trimethylsilyl)silyl alkyl acrylate tris(trimethylsilyl)silyl alkyl methacrylate, tris(trimethylsilyl)silyl alkyl itaconate, tris(trimethylsilyloxy)silyl alkyl acrylate, tris(trimethylsilyloxy)silyl alkyl methacrylate, tris(trimethylsilyloxy)silyl alkyl itaconate, alkylsilyl styrene, trimethylsilylmethyl(dimethoxy)silyloxy alkyl acrylate, trimethylsilylmethyl(dimethoxy)silyloxy alkyl methacrylate, trimethylsilylmethyl(dimethoxy)silyloxy alkyl itaconate, trimethylsilyl alkyl norbornene-5-carboxylate alkyl, tris(trimethylsilyl)silyl alkyl norbornene-5-carboxylate and tris(trimethylsilyloxy)silyl alkyl norbornene-5-carboxylate, wherein alkyl is a $C_{1-5}$ moiety.

Highly preferred species of these monomers are 3-(3,5,7,9,11,13,15-heptacyclopentylpentacyclo[9.5.1.13,9.15,15.17,13]-octasiloxan-1-yl)propyl methacrylate, 1,3,5,7,9,11,13-heptacyclopentyl-15-vinylpentacyclo[9.5.1.13,9.15,15.17,13]octasiloxane, methacrylamidotrimethylsilane, O-(methacryloxyethyl)-N-(triethoxysilylpropyl)urethane, methacryloxyethoxytrimethylsilane, N-(3-methacryloxy-2-hydroxypropyl)-3-aminopropyltriethoxysilane, (methacryloxymethyl)bis(trimethylsiloxy)methylsilane, (m,p-vinylbenzyloxy)trimethylsilane, methacryloxypropyltris(trimethylsiloxy)silane, methacryloxytrimethylsilane, 3-methacryloxypropylbis(trimethylsiloxy)methylsilane, 3-methacryloxypropyldimethylchlorosilane, methacryloxypropyldimethylethoxysilane, methacryloxypropyldimethylmethoxysilane, methacryloxypropylheptacyclopentyl-T8-silsesquioxane, methacryloxypropylmethyldichlorosilane, methacryloxypropylmethyldiethoxysilane, methacryloxypropylmethyldimethoxysilane, (methacryloxymethyl)dimethylethoxysilane, (methacryloxymethyl)phenyldimethylsilane(phenyldimethylsilyl)methylmethacrylate, methacryloxymethyltriethoxysilane, methacryloxymethyltrimethoxysilane, methacryloxymethyltris(trimethylsiloxy)silane, O-methacryloxy(polyethyleneoxy)trimethylsilane, methacryloxypropylpentamethyldisiloxane, methacryloxypropylsilatrane, methacryloxypropylsiloxane macromer, methacryloxypropyl terminated polydimethylsiloxane, methacryloxypropyltrichlorosilane, methacryloxypropyltriethoxysilane, methacryloxypropyltrimethoxysilane, methacryloxypropyltris(methoxyethoxy)silane, p-(t-butyldimethylsiloxy)styrene, butenyltriethoxysilane, 3-butenyltrimethylsilane, (3-acryloxypropyl)trimethoxysilane, (3-acryloxypropyl)tris(trimethylsiloxy)silane, O-(trimethylsilyl)acrylate, 2-trimethylsiloxyethlacrylate, N-(3-acryloxy-2-hydroxypropyl)-3-aminopropyltriethoxysilane, (3-acryloxypropyl)dimethylmethoxysilane, (3-acryloxypropyl)methylbis(trimethylsiloxy)silane, (3-acryloxypropyl)methyldichlorosilane, and (3-acryloxypropyl)methyldimethoxysilane, (3-acryloxypropyl)trichlorosilane.

The extent of protection and the amount of co-monomer present in the silicon containing polymeric additive are such that the photoresist resist composition will provide good lithography performance, i.e., high resolution and good process window. It should also maintain pattern integrity after post cure processing patterning. Examples of protecting groups which can be employed are cyclic and branched (secondary and tertiary) aliphatic carbonyls, esters or ethers containing from 3 to 30 carbon atoms, acetals, ketals and aliphatic silylethers.

Examples of cyclic or branched aliphatic carbonyls that may be employed in the present invention include, but are not limited to: phenolic carbonates; t-alkoxycarbonyloxys such as t-butoxylcarbonyloxy and isopropyloxycarbonyloxy. A highly preferred carbonate is t-butoxylcarbonyloxy.

Some examples of cyclic and branched ethers that may be employed in the present invention include, but are not limited to benzyl ether and t-alkyl ethers such t-butyl ether. Of the aforesaid ethers, it is highly preferred to use t-butyl ether.

Examples of cyclic and branched esters that can be employed are carboxylic esters having a cyclic or branched aliphatic substituent such as t-butyl ester, isobornyl ester, 2-methyl-2-admantyl ester, benzyl ester, 3-oxocyclohexanyl ester, dimethylpropylmethyl ester, mevalonic lactonyl ester, 3-hydroxy-g-butyrolactonyl ester, 3-methyl-g-butyrolactonyl ester, bis(trimethylsilyl)isopropyl ester, trimethylsilylethyl ester, tris(trimethylsilyl)silylethyl ester and cumyl ester.

Some examples of acetals and ketals that can be employed include, but are not limited to phenolic acetals and ketals as well as tetrahydrofuranyl, tetrahydropyranyl, 2-ethoxyethyl, methoxycyclohexanyl, methoxycyclopentanyl, cyclohexanyloxyethyl, ethoxycyclopentanyl, ethoxycyclohexanyl, methoxycycloheptanyl and ethoxycycloheptanyl. Of these, it is preferred that a methoxycyclohexanyl ketal be employed.

Illustrative examples of silylethers that can be employed include, but are not limited to: trimethylsilylether, dimethylethylsilylether and dimethylpropylsilylether. Of these silylethers, it is preferred that trimethylsilylether be employed.

In one embodiment, the patternable low-k dielectric material 400 is a positive-tone photoresist comprising a polymer blend of at least two silsesquioxane polymers or copolymers. The polymers or copolymers in the blend may be miscible with each other. The first silsesquioxane polymer or copolymer may be linear, branched, caged compound or combinations thereof having the following general structural formula:

where, d, e and f represent the number of each of the repeating units, $R^{12}$ represents a carbon functionality (the carbon functionality comprising at least one carbon atom) having an acid-labile protecting group, $R^{13}$ represents a group which may comprise one or more functional groups which provide polymer solubility in aqueous base, and $R^{14}$ represents a group which may comprise a carbon functionality comprising at least one carbon atom, where the carbon functionality controls polymer dissolution rate of the polymer blend into aqueous base. $R^{12}$, $R^{13}$, and $R^{14}$ may be non-identical groups. Subscripts d, e, and f represent the number of repeating units. Subscripts d and f may be integers greater than zero. For example d and f may each independently be in a range from 1 to 5,000. Subscript e may be an integer greater than or equal to zero. For example, e may be an integer in a range from 0 to 5,000.

$R^{12}$ is not limited to any specific carbon functional group, and may be selected from among conventional acid sensitive protecting groups, such as carbonates, tertiary esters, acetals, ketals, the like, and combinations thereof. For example, the acid sensitive protecting group may comprise a tert-butylacetate group, where $R^{12}$ may be:

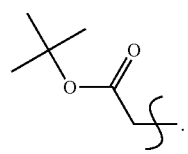

$R^{13}$ is not limited to any specific functional group, and may comprise functional groups which are substituted with —OH groups, —C(O)OH groups, —F, or combinations thereof. $R^{13}$ may comprise linear or branched alkyls, cycloalkyls, aromatics, arenes, or acrylics. For example, $R^{13}$ may be

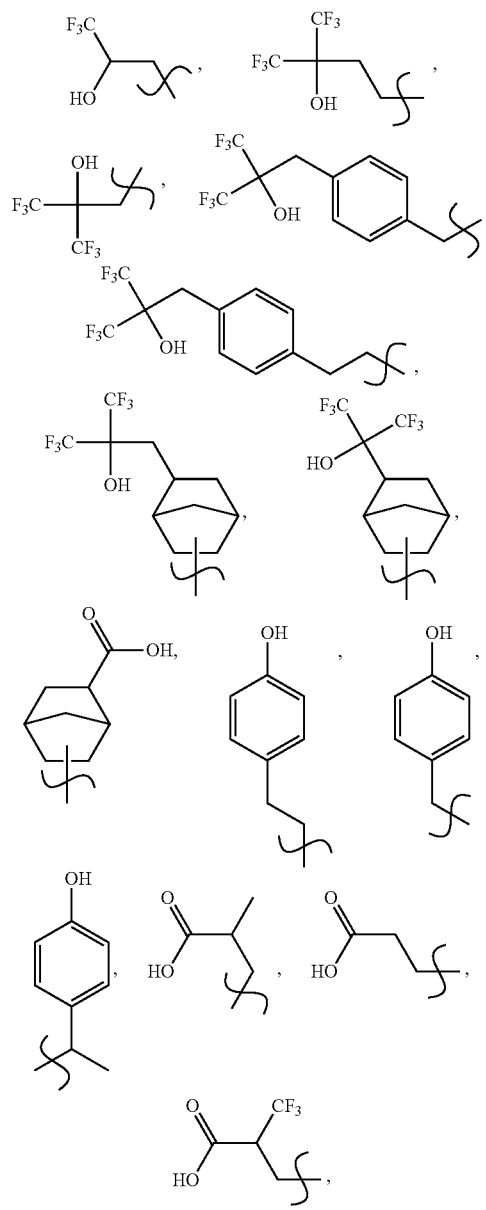

or the like.

$R^{14}$ is not necessarily limited to any specific functional group, and may comprise linear or branched alkyls, cylcoalkyls, aromatics, arenes, acrylates, or combinations thereof. For example $R^{14}$ may be:

H,

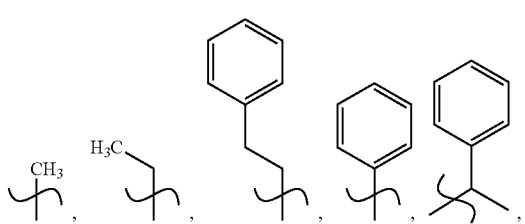

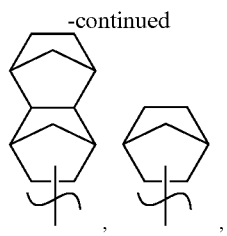

or the like.

The specific proportions and structures of $R^{12}$, $R^{13}$, and $R^{14}$ may be selected to provide a material suitable for photolithographic patterning processes.

In one embodiment, the second polymer of the polymer blend of this embodiment of positive-tone photoresist may comprise a polymer of one monomer or a copolymer including at least two monomers and wherein the monomers of the copolymers are selected from a siloxane, silane, carbosilane, oxycarbosilane, silsesquioxane, alkyltrialkoxysilane, tetra-alkoxysilane, unsaturated alkyl substituted silsesquioxane, unsaturated alkyl substituted siloxane, unsaturated alkyl substituted silane, an unsaturated alkyl substituted carbosilane, unsaturated alkyl substituted oxycarbosilane, carbosilane substituted silsesquioxane, carbosilane substituted siloxane, carbosilane substituted silane, carbosilane substituted carbosilane, carbosilane substituted oxycarbosilane, oxycarbosilane substituted silsesquioxane, oxycarbosilane substituted siloxane, oxycarbosilane substituted silane, oxycarbosilane substituted carbosilane, and oxycarbosilane substituted oxycarbosilane. In one embodiment, the second polymer of the polymer blend may comprise a copolymer of at least two monomers selected from siloxane, silane, silsesquioxane, carbosilane, or oxycarbosilane moieties. In one embodiment of the present invention, the second polymer of the polymer blend may comprise a copolymer of at least two monomers selected from an alkyltrialkoxysilane and/or a tetra-alkoxysilane. The molar ratio of the alkyltrialkoxysilane monomer in the copolymer ranges from 0 to 100%. The weight average molecular weight of the copolymer range from 100-5,000,000 g/mol, preferably 500-50,000 g/mol. Preferred copolymers are derived from at least two monomers selected from methyltrimethoxysilane, methyltriethoxysilane, ethyltrimethoxysilane, or ethyltriethoxysilane, as the alkyltrialkoxysilane monomer and tetra-methoxysilane or tetra-ethoxysilane, as the tetra-alkoxysilane monomer.

In another embodiment, the second polymer in the polymer blend for the positive-tone photoresist is a polymer having the structural formula:

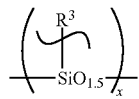

where $R^3$ may be a carbon functional group having at least one carbon atom and wherein the subscript x represents the number of repeating units and may be an integer greater than zero. The subscript q may be in a range from 4 to 50,000, such as from 10 to 1,000 for example. $R^3$ may comprise, for example, alkyls, cycloalkyls, aryl, or combinations thereof. Examples of $R^3$ include:

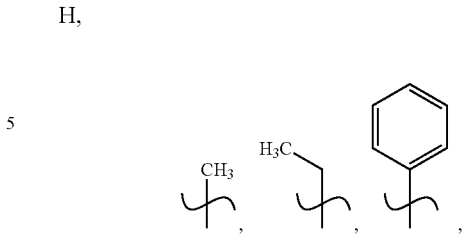

or the like.

In one embodiment, the second silsesquioxane polymer may be poly(methylsilsesquioxane) or copolymer, where $R^3$ is a methyl group, and x is an integer from 4 to 1,000. In another embodiment, x may be greater than 1,000. The second silsesquioxane polymer may also comprise a copolymer with siloxane, silane, carbosilane, oxycarbosilane, alkyltrialkoxysilane, or tetra-alkoxysilane. The second silsesquioxane polymer or copolymer structure may be caged, linear, branched, or combinations thereof. The silsesquioxane polymers of the present invention may comprise end groups comprising silanols, halosilanes, acetoxysilanes, silylamines, alkoxysilanes, and combinations thereof, which may undergo condensation reactions in the presence of an acid generated by a photoacid generator under exposure to radiation, followed by thermal baking. Polymer molecules of the second polymer may undergo chemical crosslinking with molecules of the first polymer or copolymer, the second polymer or copolymer, or a combination of these. In one embodiment of the present invention, the second silsesquioxane may be the silsesquioxane polymer or copolymer LKD 2021, LKD-2056 or LKD 2064 (products of JSR Corporation) which contain silanol end groups.

The silsesquioxane polymers or copolymers in the polymer blend may have a weight averaged molecular weight in the range from 400 to 500,000 g/mol, such as from 1500 to 10,000 g/mol, for example.

Other components of a positive-tone photoresist include a photo acid generator, a casting solvent and a base additive. These components and their compositions are well known to those skilled in the art and are similar to those in the negative-tone photoresists discussed previously.

The term "photo/acid-sensitive" is used throughout the application to denote imageable functional groups which undergo a chemical reaction in the presence of an acid generated by a photoacid generator under exposure to radiation. The acid-sensitive imageable functional groups employed may include acid-sensitive positive-tone functional groups or acid-sensitive negative-tone functional groups. The negative-tone acid-sensitive functional groups are functional groups for causing a crosslinking reaction which causes the exposed areas to be insoluble in a developer to form a negative-tone relief image after development. The positive-tone acid-sensitive functional groups are acid-sensitive protecting groups which cause the exposed region to be soluble in a developer to form positive-tone relief images after development.

In one preferred embodiment, a positive-tone photoresist 400 is used for via patterning.

The aforementioned photoresists act as a photoresist during patterning; they can be positive-tone or negative-tone, and sensitive to G-line, I-line, DUV (248 nm, 193 nm, 157 nm, 126 nm, and EUV (13.4 µm), an electron beam, or an ion beam. The patterning by exposure with light through a mask can be in a dry mode or an immersion mode wherein a liquid with a refractive index larger than that of air is inserted between the patternable low-k and the lens of the exposure tool.

Next, and as shown in FIG. 2C and as shown in FIG. 1C, the patternable low-k dielectric material 400 is pattern-wise exposed to form latent images of an interconnect pattern. An optional post-exposure baking may be required to effect the photochemical reactions. When performed, the baking step is conducted at a temperature from 60° to 200° C., with a baking temperature from 80° to 140° C. being even more preferred. The duration of the baking step varies from 10 seconds to 600 seconds and is not critical to the practice of the present invention. After exposure and post-exposure baking, the latent images are developed into the photoresist with a developer, usually 0.263N tetra-methyl-ammonium hydroxide.

The pattern-wise exposing process can be accomplished in a variety of ways, including, for example, through a mask with a lithography stepper or a scanner with an exposure light source of G-line, I-line (365 nm), DUV (248 nm, 193 nm, 157 nm, 126 nm), Extreme UV (13.4 nm), an electron beam, or an ion beam. The patterning by exposure with light through a mask can be in a dry mode or an immersion mode wherein a liquid with a refractive index larger than that of air is inserted between the patternable low-k and the lens of the exposure tool. The pattern-wise exposing process also includes direct writing without the use of a mask with, for example, light, electron beam, ion beam, and scanning probe lithography. Other patterning techniques that can be used in the present invention include contact printing techniques such as nanoimprint lithography, embroising, micro contact printing, replica molding, microtransfer molding, micromolding in capillaries and solvent-assisted micromolding, thermal assisted embroising, inject printing, and the like. These patterning techniques can be applied once or multiple times to form an interconnect structure. The multiple patterning can be accomplished with one patterning technique or a combination of the techniques. The exposure can be carried out according to well known processing in the art as would be apparent to those skilled in the art and need not be described herein in an greater detail Specifically, FIG. 2C illustrates the structure that is formed after forming the interconnect pattern 500 within the patternable low-k film 400. The interconnect pattern 500 exposes a surface of the ARC 300, if present. Typically, the width of the interconnect pattern 500 formed is from 2 nm to 10,000 nm, with a width from 20 nm to 1000 nm being even more typical. The interconnect pattern 500 may be a via pattern or a trench pattern, with via patterns being preferred in some embodiments of the invention.

Figure 5A:
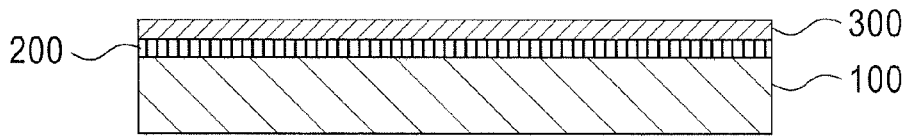
FIGS. 5A-5F are pictorial representations (through cross sectional views) depicting the basic processing steps employed in a second embodiment for fabricating a single-damascene interconnect structure using patternable dielectrics according to the present disclosure.
Figure 5B:
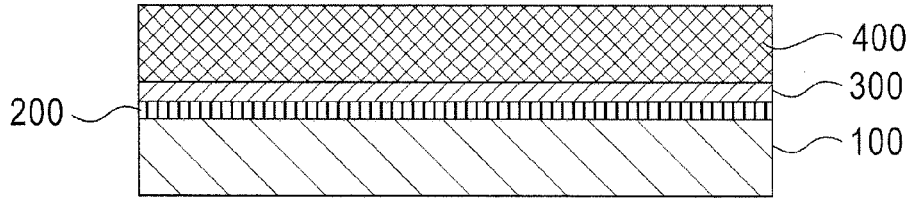

After patterning the patternable low-k material 400, resist fortification is carried out according to the present disclosure. The resist fortification provides (1) a robust surface layer on top and sidewall of the pattern to help maintain pattern integrity during post patterning cure; (2) an improved adhesion layer to conductive metal; (3) a relative dense layer to improve reliability. For example, compare FIG. 5A to FIG. 5B. FIG. 5A is an cross-sectional depiction of the pattern of the patternable low-k material 400 after the resist fortification and cure. FIG. 5B is a cross-sectional depiction of the pattern of the patternable low-k material 400 after cure but not having the resist fortification step according to the present disclosure. In addition, the resist fortification process enables a wider choice of patterning material. For instance, any Si-containing resist material, positive tone and negative tone, can be used. The resist fortification process enables a better via patterning and compatibility with immersion lithography and offers ways to reduce line edge roughness.

A typical surface fortification process according to the present disclosure can be employed to improve the surface fortification layer of the patterned photoresist. This surface fortification process can be selected from irradiation of electromagnetic wave (such as ultra-violet light), particle beam (such as an electron beam, or an ion beam), plasma treatment, chemical treatment through a gas phase or a liquid phase (such as application of a monolayer of surface modifier) or any combination thereof. The surface fortification process enhances the chemical, physical, electrical, and/or mechanical properties of the patterned photoresist, such as adhesion strength, mechanical strength to prevent pattern distortion during post patterning cure. The chemical properties include nature and/or location of surface functional groups, and hydrophilicity. The physical properties include density, moisture absorption, and heat conductivity. The mechanical properties include modulus, hardness, cohesive strength, toughness, resistance to crack and adhesion strength to its neighboring layers. The electrical properties include dielectric constant, electrical breakdown field, and leakage current.

The surface fortification process by irradiation of electromagnetic wave can be by ultra-violet (UV) light, microwave and the like. The UV light can be broadband with a wavelength range from about 100 nm to about 1000 nm. It can also be UV light generated by an excimer laser or other UV light source. The UV treatment dose can be a few $mJ/cm^2$ to thousands of $J/cm^2$, typically about 100 $mJ/cm^2$ to about 1000 $J/cm^2$, more typically about 100 $mJ/cm^2$ to about 100 $J/cm^2$, and even more typically about 1 $J/cm^2$ to about 1000 $J/cm^2$. This irradiation treatment can be conducted at ambient temperature or at an elevated temperature no higher than 500° C. This irradiation treatment can be conducted in an inert environment or within a chemical environment in a gas phase or a liquid phase. In one embodiment, the following conditions may be employed: a radiation time from about 10 sec to about 30 min, a temperature from room temperature to 500° C., and an environment including vacuum, or gases such as, for example, inert gas, $N_2$, $H_2$, $O_2$, $NH_3$, hydrocarbon, and $SiH_4$. This treatment step may or may not be performed in the same tool as that used in forming the ARC 300.

The surface fortification process by plasma treatment can be selected from oxidizing plasma, reducing plasma or a neutral plasma. Oxidizing plasmas include, for example, $O_2$, CO, and $CO_2$. Reducing plasmas include, for example, $H_2$, $N_2$, $NH_3$, and $SiH_4$. The neutral plasmas include, for example, Ar and He. A plasma treatment time from 1 sec to 10 min and a plasma treatment temperature from room temperature to about 400° C. can be employed. In some embodiments, the Oxidizing plasmas such as, $O_2$, CO, and $CO_2$ are preferred.

The post deposition chemical treatment may be conducted in a gas phase or a liquid phase. In one embodiment, the following conditions may be employed: a treatment time from about 1 sec to about 30 min, a temperature from room temperature to about 500° C. Chemicals suitable for this chemical treatment may be selected from any chemicals that improve chemical, physical, electrical, and/or mechanical properties of patterned photoresist, such as adhesion strength. This chemical treatment is limited only to the surface of the patterned photoresist. Example chemicals include adhesion promoters such as, for example, silanes, siloxanes, and silylation agents. They can also be silicon-containing compositions comprising silane, siloxane, silsesquioxane, carbosilane or oxycarbosilane This treatment step may or may not be performed in the same tool as that used in forming the photoresist patterns.

The surface fortification process generates a robust surface layer on top and sidewall of the patterned photoresist. Its composition typically comprises Si, Ge, Ti, Ta, La, Mn, as well as C, O, N and H. The thickness is a fraction of the photoresist. Typical thicknesses are about 1% to about 90% of the photoresist thickness, with about 2% to about 20% being preferred and about 3% to about 10% being more preferred.

After forming the interconnect pattern 500 and carrying out the fortification process that forms the layer 600 on the sidewalls and top of the photoresist 400, the low-k material 400 is cured forming a cured low-k material 400' (see, FIG. 2D).

Curing is performed by a thermal cure, an electron beam cure, an ultra-violet (UV) cure, an ion beam cure, a plasma cure, a microwave cure or a combination thereof. The conditions for each of the curing processes are well known to those skilled in the art and any condition can be chosen as long as it converts the photoresist into a low-k film with good electrical, physical, and mechanical properties. In other words, the cured photoresist 400' must meet the requirements of an on-chip dielectric insulator, including electrical properties (low dielectric constant: preferably k less than 4.3, and more preferably k less than 3.6, most preferably k less than 2.7; dielectric breakdown field: greater than 2 MV/cm, preferably greater than 4 MV/cm, and more preferably greater than 6 MV/cm, leakage: less than $10^{-5}$ A/cm$^2$, preferably less than $10^{-7}$ A/cm$^2$, and more preferably less than $10^{-9}$ A/cm$^2$); mechanical properties (elastic modulus greater than 2 GPa, more preferably modulus greater than 4 GPa, most preferably modulus greater than 6 GPa; Hardness greater than 0.2 GPa, more preferably modulus greater than 0.4 GPa, most preferably modulus greater than 0.6 GPa; adhesion energy equal to or greater than the cohesive energy of the weakest layer of the integrated film stack; resistant to cracking); resistant to moisture absorption; must pass electrical and mechanical reliability tests.

In another embodiment, the cured photoresist 400' contains microscopic pores generated by the added porogens or self-formed pores. The formation of the microscopic pores reduces dielectric constant of the cured photoresist 400'.

In another embodiment, the irradiation cure step is performed by a combination of a thermal cure and an ultra-violet (UV) cure wherein the wavelength of the ultra-violet (UV) light is from 50 to 300 nm and the light source for the ultra-violet (UV) cure is a UV lamp, an excimer (exciplex) laser or a combination thereof.

In one embodiment, this post patterning cure is a combined UV/thermal cure. This combined UV/thermal cure is carried on a UV/thermal cure module under vacuum or inert atmosphere, such as N$_2$, He, Ar or by vacuum. Typically, the UV/thermal cure temperature is from 100° C. to 500° C. with a cure temperature from 300° to 450° C. being more typical. The duration of the UV/thermal cure is from 0.5 min to 30 min with a duration from 1 min to 10 min being more typical. The UV cure module is designed to have a very low oxygen content to avoid degradation of the resultant dielectric materials.

The excimer laser may be generated from at least one of the excimers selected from the group consisting of Ar$_2$*, Kr$_2$*, F$_2$, Xe$_2$*, ArF, KrF, XeBr, XeCl, XeCl, XeF, CaF$_2$, KrCl, and Cl$_2$ wherein the wavelength of the excimer laser is in the range from 50 nm to 300 nm. Additionally, the light of the ultra-violet (UV) cure may be enhanced and/or diffused with a lens or other optical diffusing device known to those skilled in the art.

Further interconnect processing is then performed on the structure in FIG. 2E. In some embodiments, the substrate 100 may include a conductive feature embedded therein. When this embodiment is employed, layers 300 and 200 are first opened by etching via contacts (See, FIG. 2F) through those layers and exposing a surface of the conductive feature in the substrate 100 using the patterned and cured patternable low-k interconnect structure as an etch mask. The conductive material is then filled into the opening contacting the conductive material in the substrate 100 as shown in FIG. 2F. This includes etching through the ARC 400 and dielectric cap 200 if present, utilizing an etching process such as, for example, reactive ion etching. Next, a diffusion barrier liner (not shown), which may comprise Ta, TaN, Ti, TiN, Ru, RuTaN, RuTa, W, WN or any other material that can serve as a barrier to prevent conductive material from diffusing there through, is typically formed into the via and trench patterns by a deposition process such as, for example, atomic layer deposition (ALD), chemical vapor deposition (CVD), plasma enhanced chemical vapor deposition (PECVD), physical vapor deposition (PVD), sputtering, chemical solution deposition, or plating. In some embodiments (not shown), the diffusion barrier liner may comprise a combination of layers. The thickness of the diffusion barrier liner may vary depending on the exact means of the deposition process employed as well as the material and number of layers employed. Typically, the diffusion barrier liner has a thickness from 4 to 40 nm, with a thickness from 7 to 20 nm being more typical.

Following the formation of the diffusion barrier liner, the remaining region of the via and trench patterns is filled with a conductive material 700 forming a conductive feature. The conductive material 700 used in forming the conductive feature includes, for example, polySi, a conductive metal, an alloy comprising at least one conductive metal, a conductive metal silicide or combinations thereof. Preferably, the first conductive material 600 that is used in forming the conductive feature is a conductive metal such as Cu, W or Al, with Cu or a Cu alloy (such as AlCu) being highly preferred in the present invention. The conductive material 600 is filled into the remaining via and trench patterns utilizing a conventional deposition process including, but not limited to CVD, PECVD, sputtering, chemical solution deposition or plating.

After deposition, a conventional planarization process such as, for example, chemical mechanical polishing (CMP) can be used to provide a structure in which the diffusion barrier liner and the conductive material 700 each have an upper surface that is substantially coplanar with the upper surface 600 of the cured low-k material 400'.

After forming the conductive material 700, another dielectric cap 800 is formed on the surface of the cured low-k material 400' utilizing a conventional deposition process such as, for example, chemical vapor deposition (CVD), plasma enhanced chemical vapor deposition (PECVD), atomic layer deposition (ALD), chemical solution deposition, or evaporation. The dielectric cap comprises any suitable dielectric capping material such as, for example, SiC, SiN, SiO$_2$, a carbon doped oxide, a nitrogen and hydrogen doped silicon carbide SiC(N,H) or multilayers thereof. This dielectric cap can be a continuous layer or a discontinuous layer. It can also be a select cap, such as CoWP. The thickness of the dielectric cap may vary depending on the technique used to form the same as well as the material make-up of the layer. Typically, the dielectric cap has a thickness from 5 to 55 nm, with a thickness from 20 to 45 nm being more typical.

Reference is now made to FIGS. 5A-5F which illustrate another embodiment of the present invention in which a single-damascene structure is provided using patternable dielectrics as on-chip electrical insulators on a semiconductor chip. In the illustrated embodiment, a material stack including an optional dielectric cap 200 and an optional ARC 300 are shown on substrate 100. Please see FIG. 5A. Although both layers 200 and 300 are shown, the present disclosure also works without either layer present, or with ARC 300 or dielectric cap 200 present only.

FIG. 5A illustrates an initial structure that is utilized in this embodiment. The initial structure includes a substrate 100, an optional dielectric cap 200 located on a surface of substrate 12, and optional antireflective coating 300 located on a surface of the optional dielectric cap 200.

The optional dielectric cap 200 is formed directly on the surface of substrate 100 utilizing a conventional deposition process such as, for example, chemical vapor deposition (CVD), plasma enhanced chemical vapor deposition (PECVD), atomic layer deposition (ALD), chemical solution deposition (such as spin coating), or evaporation.

After the deposition of the dielectric cap 200, a post deposition treatment may be applied to modify the properties of either the entire layer or the surface of the dielectric cap 200. This post deposition treatment can be selected from heat treatment, irradiation of electromagnetic wave (such as of ultraviolet light), particle beam (such as an electron beam, or an ion beam), plasma treatment, chemical treatment through a gas phase or a liquid phase (such as application of a monolayer of surface modifier) or any combination thereof. This post-deposition treatment can be blanket or pattern-wise.

The heat treatment should be no high than the temperature that the underlying substrate can withstand, usually 500° C. This heat treatment can be conducted in an inert environment or within a chemical environment in a gas phase or a liquid phase. This treatment step may or may not be performed in the same tool as that used in forming the dielectric cap 200.

The post deposition treatment by irradiation of electromagnetic wave can be by ultra-violet (UV) light, microwave and the like. The post deposition treatment by plasma treatment can be selected from oxidizing plasma, reducing plasma or a neutral plasma.

Next, an optional antireflective coating (ARC) 300 is formed on a surface of the optional dielectric cap 200, if present, or directly on a surface of the substrate 100 when the dielectric cap 200 is not present. In one embodiment, the ARC 300 is included within the structure. ARC 300 may be a single layer, multilayer or a graded layer with a composition that varies along the vertical direction.

Next, and as illustrated in FIG. 5B, a photoresist 400, which combines the function of a photoresist and low-k material into one single material is provided. In the embodiment illustrated, the photoresist 400 is provided on the surface of the ARC 300. In other embodiments, the photoresist 400 can be provided directly on the dielectric cap 200 (when no ARC 300 is present) or directly on the surface of substrate 100 (when neither ARC 300 nor dielectric cap 200 is present).

Figure 5C:
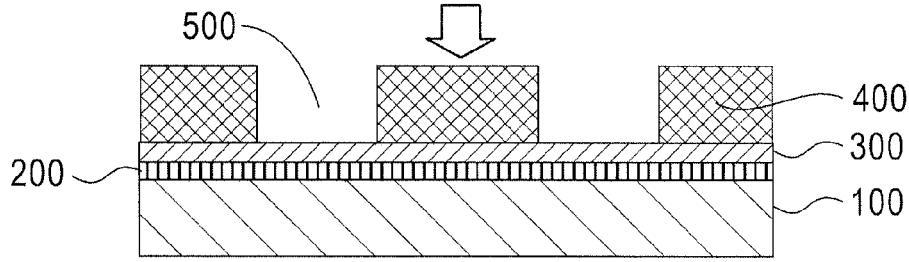
Figure 5D:
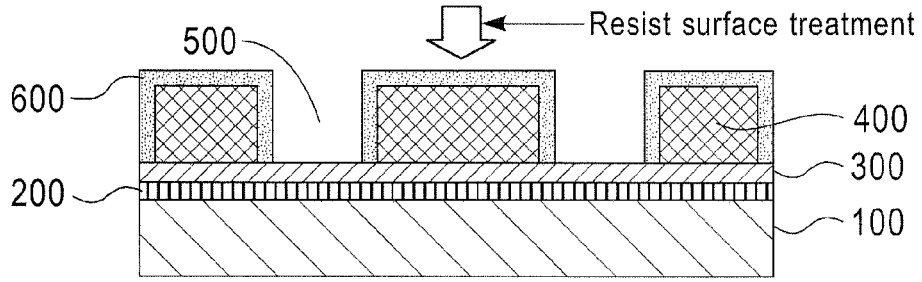

Next, and as shown in FIG. 5C, the patternable low-k dielectric material 400 is pattern-wise exposed to form latent images of an interconnect pattern. An optional post-exposure baking may be required to effect the photochemical reactions.

Specifically, FIG. 5C illustrates the structure that is formed after forming the interconnect pattern 500 within the patternable low-k film 400. The interconnect pattern 500 exposes a surface of the ARC 300, if present.

After patterning the photoresist 400, resist fortification is carried out according to the present disclosure. The fortification process forms the layer 600 on the sidewalls and top of the photoresist 400

Figure 5E:
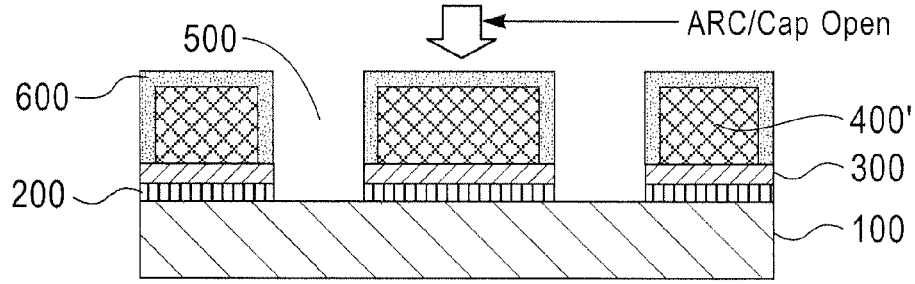

Further interconnect processing is then performed on the structure in FIG. 5E. In some embodiments, the substrate 100 may include a conductive feature embedded therein. When this embodiment is employed, layers 300 and 200 are first opened by etching via contacts (see FIG. 5E) through those layers and exposing a surface of the conductive feature in the substrate 100 using the patterned patternable low-k interconnect structure as an etch mask. This includes etching through the ARC 400 and dielectric cap 200 if present, utilizing an etching process such as, for example, reactive ion etching. After forming the interconnect pattern 500 carrying out the fortification process and forming the vias, the low-k material 400 is cured forming a cured low-k material 400' (see, FIG. 5E).

Figure 5F:
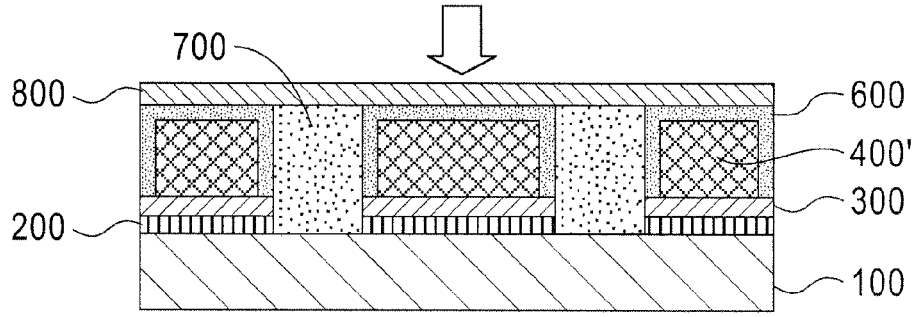

After forming the interconnect pattern 500 carrying out the fortification process and forming the vias, the low-k material 400 is cured forming a cured low-k material 400' (see, FIG. 5E). The conductive material is then filled into the opening contacting the conductive material in the substrate 100 as shown in FIG. 5F.

Following the formation of the diffusion barrier liner, the remaining region of the via and trench patterns is filled with a conductive material 700 forming a conductive feature.

After deposition, a conventional planarization process such as, for example, chemical mechanical polishing (CMP) can be used to provide a structure in which the diffusion barrier liner and the conductive material 600 each have an upper surface that is substantially coplanar with the upper surface 600 of the cured low-k material 400'.

After forming the conductive material 700, another dielectric cap 800 is formed on the surface 600 of the cured low-k material 400' utilizing a conventional deposition process such as, for example, chemical vapor deposition (CVD), plasma enhanced chemical vapor deposition (PECVD), atomic layer deposition (ALD), chemical solution deposition, or evaporation. The dielectric cap comprises any suitable dielectric capping material such as, for example, SiC, SiN, $SiO_2$, a carbon doped oxide, a nitrogen and hydrogen doped silicon carbide SiC(N,H) or multilayers thereof. This dielectric cap can be a continuous layer or a discontinuous layer. It can also be a select cap, such as CoWP.

Reference is now made to FIGS. 6A-6I and FIGS. 7A-7J which illustrate another embodiment of the present invention in which a dual-damascene structure is provided using patternable dielectrics as on-chip electrical insulators on a semiconductor chip. In the illustrated embodiment, a material stack including an optional dielectric cap 200 and an optional ARC 300 are shown on substrate 100. Please see FIG. 7A. Although both layers 200 and 300 are shown, the present disclosure also works without either layer present, or with ARC 300 or dielectric cap 200 present only.

Figure 6:
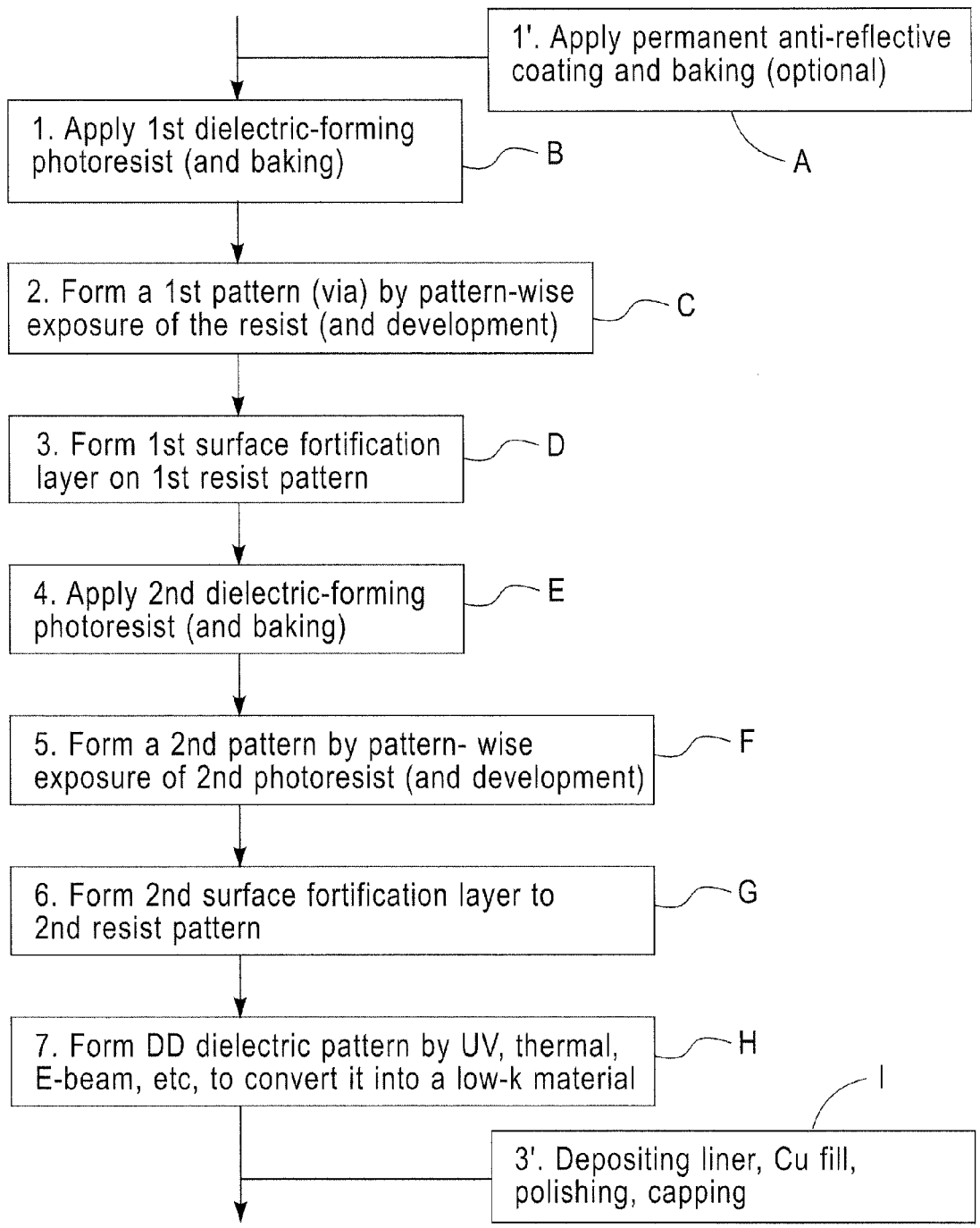
FIGS. 6A-6I illustrate a process flow for a dual-damascene process according to the present disclosure.

FIG. 6A illustrates an initial structure that is utilized in this embodiment. The initial structure includes a substrate 100, an optional dielectric cap 200 located on a surface of substrate 100, and optional antireflective coating 300 located on a surface of the optional dielectric cap 200.

The optional dielectric cap 200 is formed directly on the surface of substrate 100 utilizing a conventional deposition process such as, for example, chemical vapor deposition (CVD), plasma enhanced chemical vapor deposition (PECVD), atomic layer deposition (ALD), chemical solution deposition (such as spin coating), or evaporation.

After the deposition of the dielectric cap 200, a post deposition treatment may be applied to modify the properties of either the entire layer or the surface of the dielectric cap 200. This post deposition treatment can be selected from heat treatment, irradiation of electromagnetic wave (such as of ultraviolet light), particle beam (such as an electron beam, or an ion beam), plasma treatment, chemical treatment through a gas phase or a liquid phase (such as application of a monolayer of surface modifier) or any combination thereof. This post-deposition treatment can be blanket or pattern-wise.

The heat treatment should be no high than the temperature that the underlying substrate can withstand, usually 500° C. This heat treatment can be conducted in an inert environment or within a chemical environment in a gas phase or a liquid phase. This treatment step may or may not be performed in the same tool as that used in forming the dielectric cap 200.

The post deposition treatment by irradiation of electromagnetic wave can be by ultra-violet (UV) light, microwave and the like. The post deposition treatment by plasma treatment can be selected from oxidizing plasma, reducing plasma or a neutral plasma.

Next, an optional antireflective coating (ARC) 300 is formed on a surface of the optional dielectric cap 200, if present, or directly on a surface of the substrate 100 when the dielectric cap 200 is not present. In one embodiment, the ARC 300 is included within the structure. ARC 300 may be a single layer, multilayer or a graded layer with a composition that varies along the vertical direction.

Next, and as illustrated in FIG. 7B, a first photoresist 400, which combines the function of a photoresist and low-k material into one single material is provided. In the embodiment illustrated, the photoresist 400 is provided on the surface of the ARC 300. In other embodiments, the first photoresist 400 can be provided directly on the dielectric cap 200 (when no ARC 300 is present) or directly on the surface of substrate 100 (when neither ARC 300 nor dielectric cap 200 is present).

Next, and as shown in FIG. 7C, the first patternable low-k dielectric material 400 is pattern-wise exposed to form latent images of an interconnect pattern. An optional post-exposure baking may be required to effect the photochemical reactions.

Specifically, FIG. 7C illustrates the structure that is formed after forming the interconnect pattern 500 within the first patternable low-k film 400. The interconnect pattern 500 exposes a surface of the ARC 300, if present.

After patterning the first photoresist 400, resist fortification is carried out according to the present disclosure.

After forming the interconnect pattern 500 and carrying out the fortification process that forms the layer 600 on the sidewalls and top of the photoresist 400, the low-k material 400 is cured forming a cured low-k material 400' (see, FIG. 7D).

After patterning and curing the first photoresist 400, a second photoresist 850 is then formed providing the structure shown in FIG. 7F. As shown, the second photoresist completely fills the at least one via pattern 500 and extends onto an upper surface of the first photoresist. The second photoresist 800 may comprise the same or different material as the first photoresist 400. The deposition processes and thickness mentioned above for the first photoresist 400 are each applicable here for the second photoresist 850. Typically, the first photoresist 400 is a positive-tone material, and the second low-k material 850 is either a negative-tone or a positive-tone material.

Figure 7G:
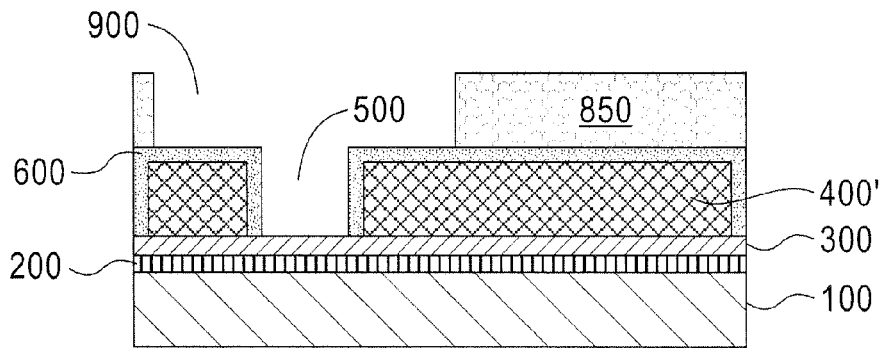
Figure 7H:
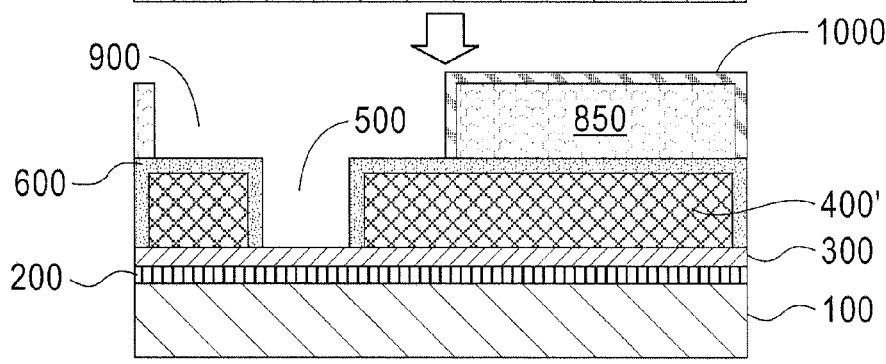

Next, and as shown in FIG. 7G, the second patternable low-k dielectric material 850 is patterned to form at least one second interconnect pattern 900 within the second patternable low-k dielectric material 800. It is noted that during the at least one second interconnect pattern 900 formation a portion of the second photoresist remains in the at least one first interconnect pattern 500 of the first dimension providing a final interconnect via pattern. The patterning of the second patternable low-dielectric material 850 is performed utilizing the same basic processing equipment, conditions and steps as those used for patterning the first patternable low-k dielectric material 400. The at least one second interconnect pattern 900 is the other of a via pattern or a trench pattern not employed as the at least one first interconnect pattern 500.

After patterning the second photoresist 850, resist fortification is carried out according to the present disclosure. See FIG. 7H.

Figure 7I:
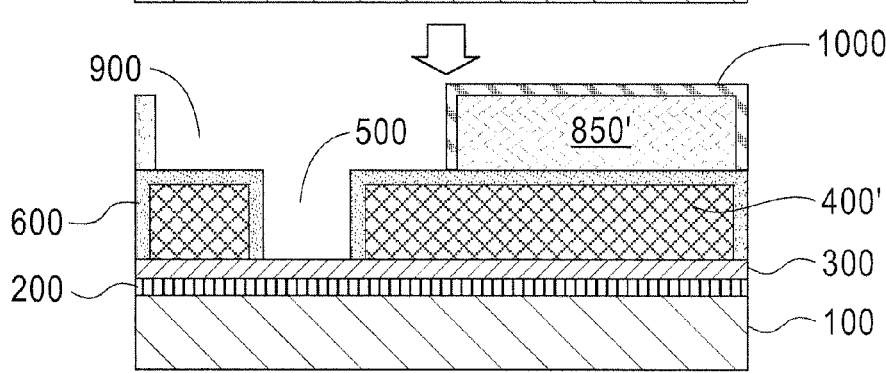

After forming the interconnect pattern 900 and carrying out the fortification process that forms the layer 1000 on the sidewalls and top of the photoresist 850, the low-k material 850 is cured forming a cured low-k material 850' (see, FIG. 7I). In FIG. 7I, reference numeral 850' denotes the cured second low-k material. Like the first cured low-k material 400', the cured second low-k material 850' has a dielectric constant within the ranges mentioned above.

Figure 7J:
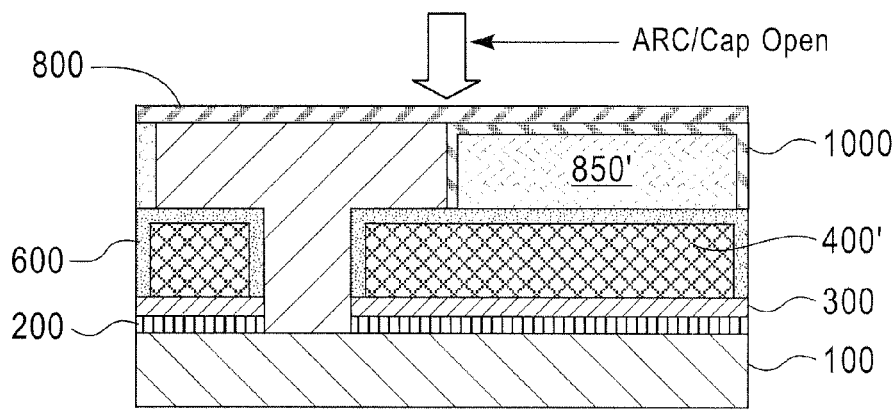

After the dual-damascene interconnect structure is formed, via contacts are formed through the ARC/cap layer to form contact with the underlying substrates (FIG. 7J). These via contacts can be formed with the reactive ion etching process well known to those skilled in the art. Layers 300 and 200 are first opened by etching via contacts through those layers and exposing a surface of the conductive feature in the substrate 100 using the patterned and cured patternable low-k interconnect structure as an etch mask. The conductive material is then filled into the opening contacting the conductive material in the substrate 100 as shown in FIG. 7J. This includes etching through the ARC 300 and dielectric cap 200 if present, utilizing an etching process such as, for example, reactive ion etching. An optional diffusion barrier liner (not shown) can be formed in the via.

Following the formation of the diffusion barrier liner, the remaining region of the via and trench patterns is filled with a conductive material 700 forming a conductive feature.

After deposition, a conventional planarization process such as, for example, chemical mechanical polishing (CMP) can be used to provide a structure in which the diffusion barrier liner and the conductive material 700 each have an upper surface that is substantially coplanar with the upper surface 1000 of the cured low-k material 850'.

After forming the conductive material 700, another dielectric cap 800 is formed on the surface of the cured low-k material 400' utilizing a conventional deposition process such as, for example, chemical vapor deposition (CVD), plasma enhanced chemical vapor deposition (PECVD), atomic layer deposition (ALD), chemical solution deposition, or evaporation. The dielectric cap comprises any suitable dielectric capping material such as, for example, SiC, SiN, $SiO_2$, a carbon doped oxide, a nitrogen and hydrogen doped silicon carbide SiC(N,H) or multilayers thereof. This dielectric cap can be a continuous layer or a discontinuous layer. It can also be a select cap, such as CoWP.

Figure 8A:
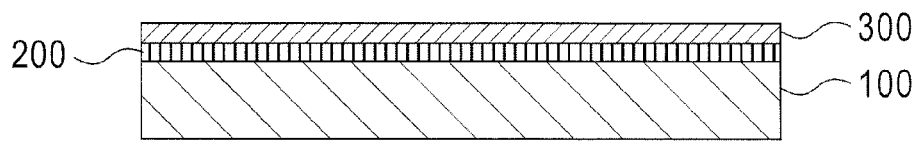
FIGS. 8A-8J are pictorial representations (through cross sectional views) depicting the basic processing steps employed in another embodiment for fabricating a dual-damascene interconnect structure using patternable dielectrics according to the present disclosure.

Reference is now made to FIGS. 8A-6J which illustrate another embodiment of the present invention in which a dual-damascene structure is provided using patternable dielectrics as on-chip electrical insulators on a semiconductor chip. In the illustrated embodiment, a material stack including an optional dielectric cap 200 and an optional ARC 300 are shown on substrate 100. Please see FIG. 8A. Although both layers 200 and 300 are shown, the present disclosure also works without either layer present, or with ARC 300 or dielectric cap 200 present only.

FIG. 8A illustrates an initial structure that is utilized in this embodiment. The initial structure includes a substrate 100, an optional dielectric cap 200 located on a surface of substrate 100, and optional antireflective coating 300 located on a surface of the optional dielectric cap 200.

The optional dielectric cap 200 is formed directly on the surface of substrate 100 utilizing a conventional deposition process such as, for example, chemical vapor deposition (CVD), plasma enhanced chemical vapor deposition (PECVD), atomic layer deposition (ALD), chemical solution deposition (such as spin coating), or evaporation.

After the deposition of the dielectric cap 200, a post deposition treatment may be applied to modify the properties of either the entire layer or the surface of the dielectric cap 200. This post deposition treatment can be selected from heat treatment, irradiation of electromagnetic wave (such as of ultraviolet light), particle beam (such as an electron beam, or an ion beam), plasma treatment, chemical treatment through a gas phase or a liquid phase (such as application of a monolayer of surface modifier) or any combination thereof. This post-deposition treatment can be blanket or pattern-wise.

The heat treatment should be no high than the temperature that the underlying substrate can withstand, usually 500° C. This heat treatment can be conducted in an inert environment or within a chemical environment in a gas phase or a liquid phase. This treatment step may or may not be performed in the same tool as that used in forming the dielectric cap 200.

The post deposition treatment by irradiation of electromagnetic wave can be by ultra-violet (UV) light, microwave and the like. The post deposition treatment by plasma treatment can be selected from oxidizing plasma, reducing plasma or a neutral plasma.

Next, an optional antireflective coating (ARC) 300 is formed on a surface of the optional dielectric cap 200, if present, or directly on a surface of the substrate 100 when the dielectric cap 200 is not present. In one embodiment, the ARC 300 is included within the structure. ARC 300 may be a single layer, multilayer or a graded layer with a composition that varies along the vertical direction.

Figure 8B:
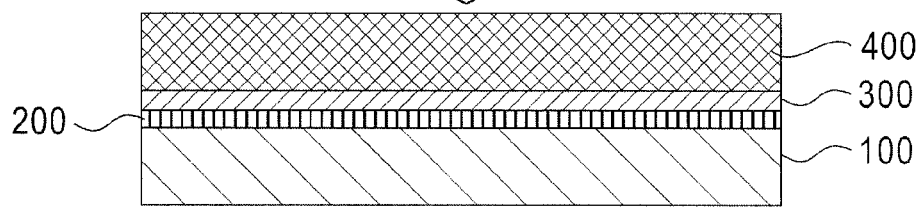

Next, and as illustrated in FIG. 8B, a first photoresist 400, which combines the function of a photoresist and low-k material into one single material is provided. In the embodiment illustrated, the photoresist 400 is provided on the surface of the ARC 300. In other embodiments, the first photoresist 400 can be provided directly on the dielectric cap 200 (when no ARC 300 is present) or directly on the surface of substrate 100 (when neither ARC 300 nor dielectric cap 200 is present).

Figure 8C:
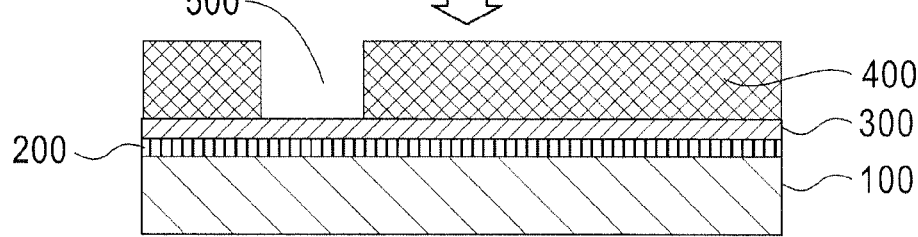

Next, and as shown in FIG. 8C, the first patternable low-k dielectric material 400 is pattern-wise exposed to form latent images of an interconnect pattern. An optional post-exposure baking may be required to effect the photochemical reactions.

Specifically, FIG. 8C illustrates the structure that is formed after forming the interconnect pattern 500 within the first patternable low-k film 400. The interconnect pattern 500 exposes a surface of the ARC 300, if present.

Figure 8D:
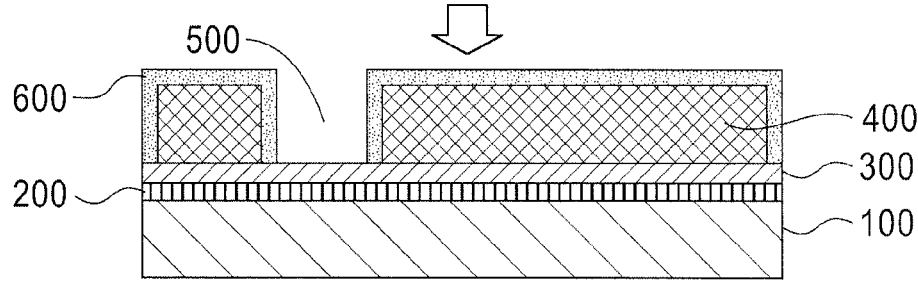

After patterning the first photoresist 400, resist fortification is carried out according to the present disclosure. See FIG. 8D.

Figure 8E:
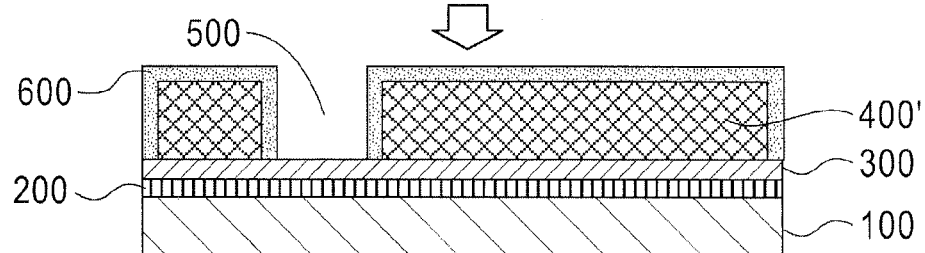

After forming the interconnect pattern 500 and carrying out the fortification process that forms the layer 600 on the sidewalls and top of the photoresist 400, the low-k material 400 is cured forming a cured low-k material 400' (see, FIG. 8E).

Figure 8F:
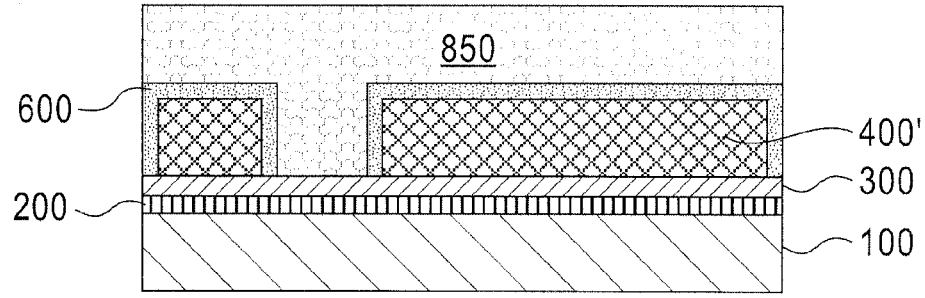

After patterning and curing the first photoresist 400, a second photoresist 850 is then formed providing the structure shown in FIG. 8F. As shown, the second photoresist completely fills the at least one via pattern 500 and extends onto an upper surface of the first photoresist. The second photoresist 850 may comprise the same or different material as the first photoresist 400. The deposition processes and thickness mentioned above for the first photoresist 400 are each applicable here for the second photoresist 850. Typically, the first photoresist 400 is a positive-tone material, and the second low-k material 850 is either a negative-tone or a positive-tone material.

Figure 8G:
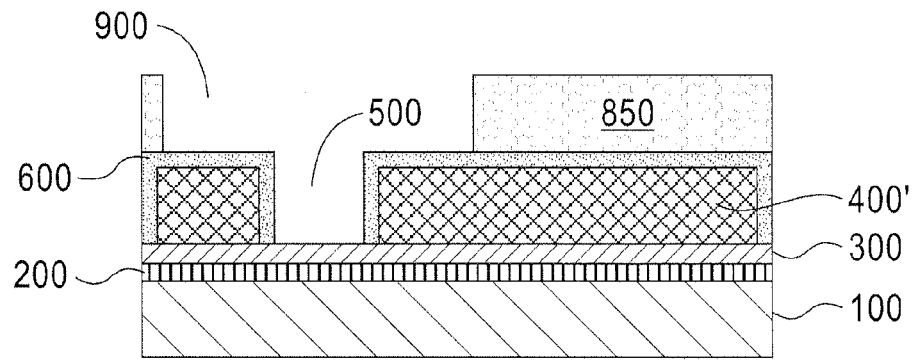

Next, and as shown in FIG. 8G, the second patternable low-k dielectric material 850 is patterned to form at least one second interconnect pattern 900 within the second patternable low-k dielectric material 850. It is noted that during the at least one second interconnect pattern 900 formation a portion of the second photoresist remains in the at least one first interconnect pattern 500 of the first dimension providing a final interconnect via pattern. The patterning of the second patternable low-dielectric material 850 is performed utilizing the same basic processing equipment, conditions and steps as those used for patterning the first patternable low-k dielectric material 400. The at least one second interconnect pattern 900 is the other of a via pattern or a trench pattern not employed as the at least one first interconnect pattern 500.

Figure 8H:
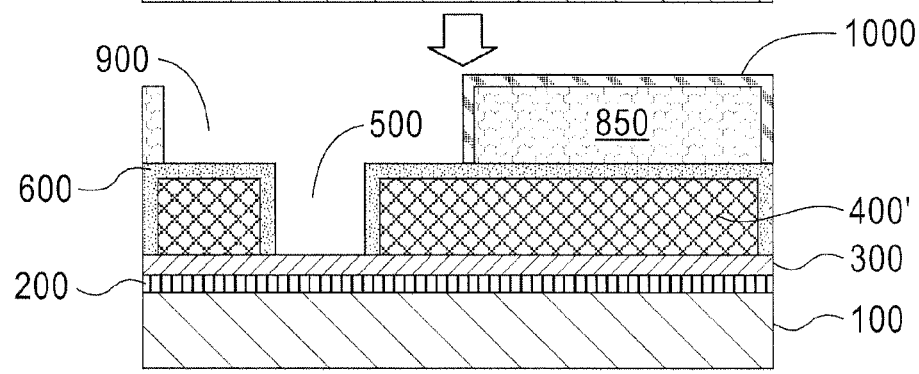

After patterning the second photoresist 850, resist fortification is carried out according to the present disclosure. See FIG. 8H. The fortification process forms the layer 1000 on the sidewalls and top of the photoresist 850.

Figure 8I:
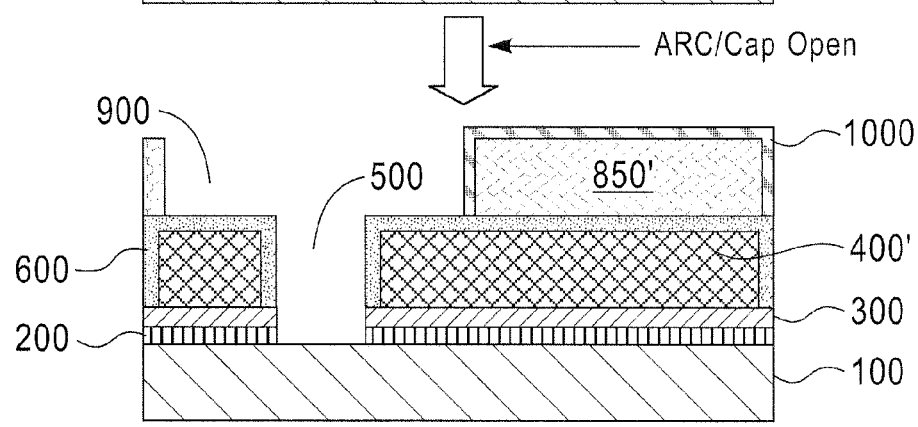

After the dual-damascene interconnect structure is formed, via contacts are formed through the ARC/cap layer to form contact with the underlying substrates (FIG. 8I). These via contacts can be formed with the reactive ion etching process well known to those skilled in the art. Layers 300 and 200 are first opened by etching via contacts through those layers and exposing a surface of the conductive feature in the substrate 100 using the patterned and cured patternable low-k interconnect structure as an etch mask.

Next, the low-k material 800 is cured forming a cured low-k material 800' (see, FIG. 8I). In FIG. 8I, reference numeral 800' denotes the cured second low-k material. Like the first cured low-k material 400', the cured second low-k material 850' has a dielectric constant within the ranges mentioned above.

Figure 8J:
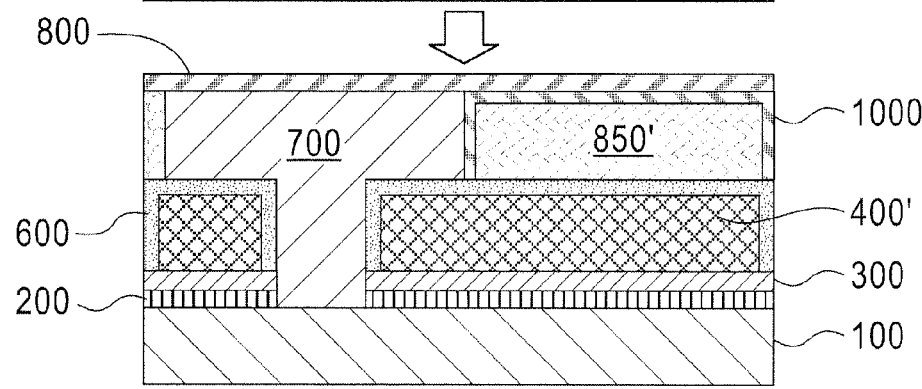

The conductive material is then filled into the opening contacting the conductive material in the substrate 100 as shown in FIG. 8J. This includes etching through the ARC 300 and dielectric cap 200 if present, utilizing an etching process such as, for example, reactive ion etching. An optional diffusion barrier liner (not shown) can be formed in the via.

Following the formation of the diffusion barrier liner, the remaining region of the via and trench patterns is filled with a conductive material 700 forming a conductive feature.

After deposition, a conventional planarization process such as, for example, chemical mechanical polishing (CMP) can be used to provide a structure in which the diffusion barrier liner and the conductive material 600 each have an upper surface that is substantially coplanar with the upper surface 1000 of the cured low-k material 850'.

After forming the conductive material 700, another dielectric cap 800 is formed on the surface 1000 of the cured low-k material 400' utilizing a conventional deposition process such as, for example, chemical vapor deposition (CVD), plasma enhanced chemical vapor deposition (PECVD), atomic layer deposition (ALD), chemical solution deposition, or evaporation. The dielectric cap comprises any suitable dielectric capping material such as, for example, SiC, SiN, $SiO_2$, a carbon doped oxide, a nitrogen and hydrogen doped silicon carbide SiC(N,H) or multilayers thereof. This dielectric cap can be a continuous layer or a discontinuous layer. It can also be a select cap, such as CoWP.

Reference is now made to FIGS. 9A-9J which illustrate still further embodiment of the present invention in which another dual-damascene structure is provided using patternable dielectrics as on-chip electrical insulators on a semiconductor chip. In the illustrated embodiment, a material stack including an optional dielectric cap 200 and an optional ARC 300 are shown on substrate 100. Please see FIG. 9A. Although both layers 200 and 300 are shown, the present disclosure also works without either layer present, or with ARC 300 or dielectric cap 200 present only.

FIG. 9A illustrates an initial structure that is utilized in this embodiment. The initial structure includes a substrate 100, an optional dielectric cap 200 located on a surface of substrate 100, and optional antireflective coating 300 located on a surface of the optional dielectric cap 200.

The optional dielectric cap 200 is formed directly on the surface of substrate 100 utilizing a conventional deposition process such as, for example, chemical vapor deposition (CVD), plasma enhanced chemical vapor deposition (PECVD), atomic layer deposition (ALD), chemical solution deposition (such as spin coating), or evaporation.

After the deposition of the dielectric cap 200, a post deposition treatment may be applied to modify the properties of either the entire layer or the surface of the dielectric cap 200. This post deposition treatment can be selected from heat treatment, irradiation of electromagnetic wave (such as of ultraviolet light), particle beam (such as an electron beam, or an ion beam), plasma treatment, chemical treatment through a gas phase or a liquid phase (such as application of a monolayer of surface modifier) or any combination thereof. This post-deposition treatment can be blanket or pattern-wise.

The heat treatment should be no high than the temperature that the underlying substrate can withstand, usually 500° C. This heat treatment can be conducted in an inert environment or within a chemical environment in a gas phase or a liquid phase. This treatment step may or may not be performed in the same tool as that used in forming the dielectric cap 200.

The post deposition treatment by irradiation of electromagnetic wave can be by ultra-violet (UV) light, microwave and the like. The post deposition treatment by plasma treatment can be selected from oxidizing plasma, reducing plasma or a neutral plasma.

Next, an optional antireflective coating (ARC) 300 is formed on a surface of the optional dielectric cap 200, if present, or directly on a surface of the substrate 100 when the dielectric cap 200 is not present. In one embodiment, the ARC 300 is included within the structure. ARC 300 may be a single layer, multilayer or a graded layer with a composition that varies along the vertical direction.

Next, and as illustrated in FIG. 9B, a first photoresist 400, which combines the function of a photoresist and low-k material into one single material is provided. In the embodiment illustrated, the photoresist 400 is provided on the surface of the ARC 300. In other embodiments, the first photoresist 400 can be provided directly on the dielectric cap 200 (when no ARC 300 is present) or directly on the surface of substrate 100 (when neither ARC 300 nor dielectric cap 200 is present).

Next, and as shown in FIG. 9C, the first patternable low-k dielectric material 400 is pattern-wise exposed to form latent images of an interconnect pattern. An optional post-exposure baking may be required to effect the photochemical reactions.

Specifically, FIG. 9C illustrates the structure that is formed after forming the interconnect pattern 500 within the first patternable low-k film 400. The interconnect pattern 500 exposes a surface of the ARC 300, if present.

After patterning the first photoresist 400, resist fortification is carried out according to the present disclosure.

After forming the interconnect pattern 500 and carrying out the fortification process that forms the layer 600 on the sidewalls and top of the photoresist 400, the low-k material 400 is cured forming a cured low-k material 400' (see, FIG. 9D).

After patterning and curing the first photoresist 400, a second photoresist 850 is then formed providing the structure shown in FIG. 9F. As shown, the second photoresist completely fills the at least one via pattern 500 and extends onto an upper surface of the first photoresist. The second photoresist 850 may comprise the same or different material as the first photoresist 400. The deposition processes and thickness mentioned above for the first photoresist 400 are each applicable here for the second photoresist 850. Typically, the first photoresist 400 is a positive-tone material, and the second low-k material 850 is either a negative-tone or a positive-tone material.

Figure 9G:
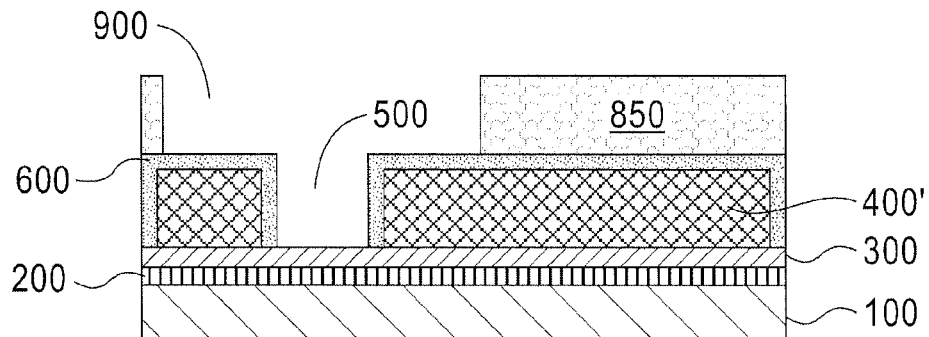

Next, and as shown in FIG. 9G, the second patternable low-k dielectric material 850 is patterned to form at least one second interconnect pattern 900 within the second patternable low-k dielectric material 850. It is noted that during the at least one second interconnect pattern 900 formation a portion of the second photoresist remains in the at least one first interconnect pattern 500 of the first dimension providing a final interconnect via pattern. The patterning of the second patternable low-dielectric material 850 is performed utilizing the same basic processing equipment, conditions and steps as those used for patterning the first patternable low-k dielectric material 400. The at least one second interconnect pattern 900 is the other of a via pattern or a trench pattern not employed as the at least one first interconnect pattern 500.

Figure 9H:
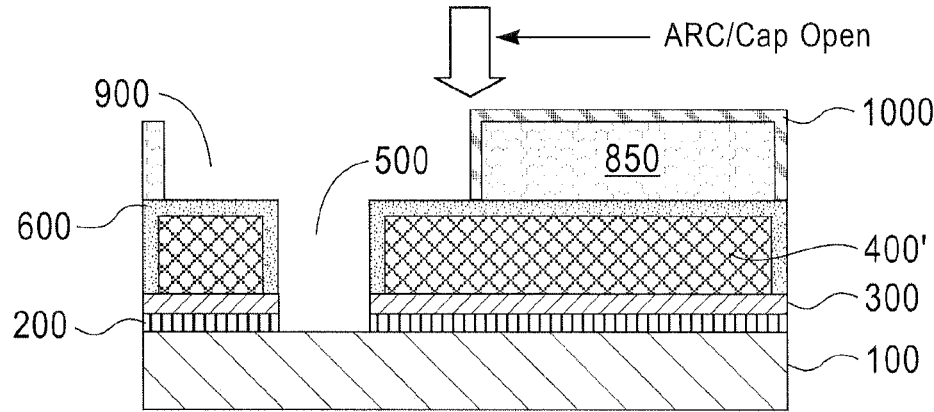

Next, via contacts are formed through the ARC/cap layer to form contact with the underlying substrates (FIG. 9H). These via contacts can be formed with the reactive ion etching process well known to those skilled in the art. Layers 300 and 200 are first opened by etching via contacts through those layers and exposing a surface of the conductive feature in the substrate 100 using the patterned patternable low-k interconnect structure as an etch mask.

After forming the via contacts, resist fortification of the second photoresist 850 is carried out according to the present disclosure. See FIG. 9H.

Figure 9I:
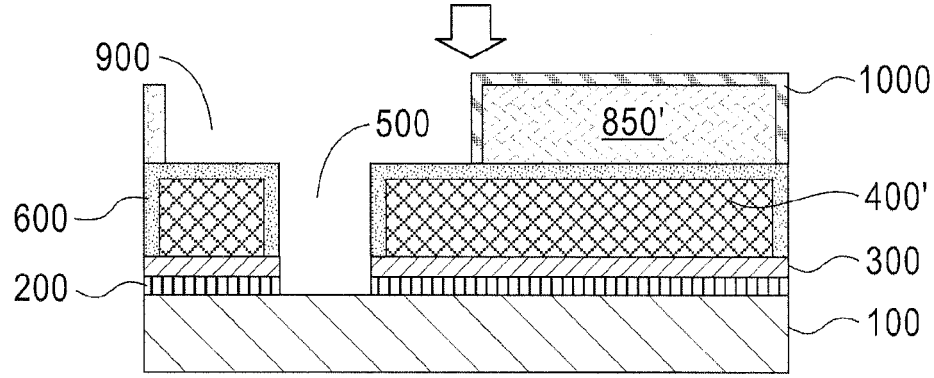

After forming the interconnect pattern 900 and carrying out the fortification process that forms the layer 1000 on the sidewalls and top of the photoresist 850, the low-k material 850 is cured forming a cured low-k material 850' (see, FIG. 9I). In FIG. 9I, reference numeral 850' denotes the cured second low-k material. Like the first cured low-k material 400', the cured second low-k material 850' including has a dielectric constant within the ranges mentioned above.

Figure 9J:
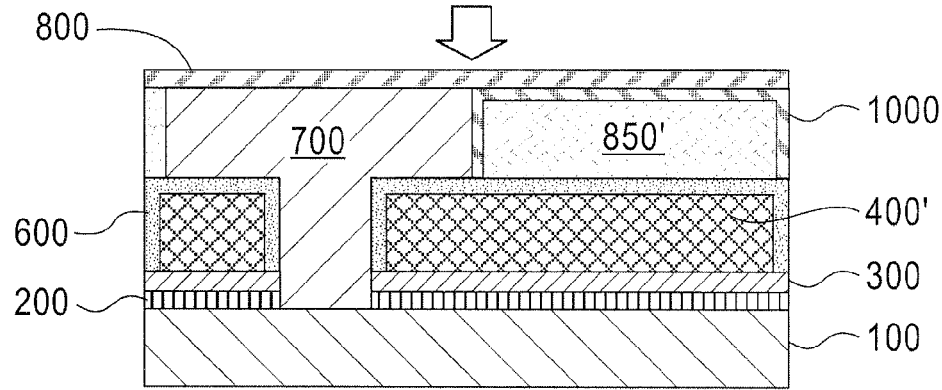

The conductive material is then filled into the opening contacting the conductive material in the substrate 100 as shown in FIG. 9J. This includes etching through the ARC 300 and dielectric cap 200 if present, utilizing an etching process such as, for example, reactive ion etching. An optional diffusion barrier liner (not shown) can be formed in the via.

Following the formation of the diffusion barrier liner, the remaining region of the via and trench patterns is filled with a conductive material 700 forming a conductive feature.

After deposition, a conventional planarization process such as, for example, chemical mechanical polishing (CMP) can be used to provide a structure in which the diffusion barrier liner and the conductive material 700 each have an upper surface that is substantially coplanar with the upper surface 1000 of the cured low-k material 850'.

After forming the conductive material 700, another dielectric cap 800 is formed on the surface 1000 of the cured low-k material 850' utilizing a conventional deposition process such as, for example, chemical vapor deposition (CVD), plasma enhanced chemical vapor deposition (PECVD), atomic layer deposition (ALD), chemical solution deposition, or evaporation. The dielectric cap comprises any suitable dielectric capping material such as, for example, SiC, SiN, $SiO_2$, a carbon doped oxide, a nitrogen and hydrogen doped silicon carbide SiC(N,H) or multilayers thereof. This dielectric cap can be a continuous layer or a discontinuous layer. It can also be a select cap, such as CoWP.

Reference is now made to FIGS. 10A-10I which illustrate a further embodiment of the present invention in which a dual-damascene structure is provided using patternable dielectrics as on-chip electrical insulators on a semiconductor chip. In the illustrated embodiment, a material stack including an optional dielectric cap 200 and an optional ARC 300 are shown on substrate 100. Please see FIG. 10A. Although both layers 200 and 300 are shown, the present disclosure also works without either layer present, or with ARC 300 or dielectric cap 200 present only.

Figure 10A:
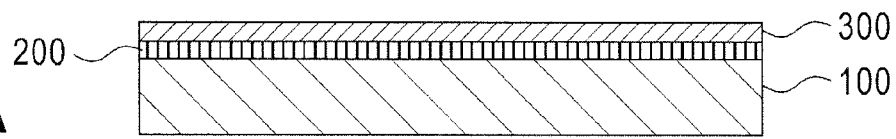
FIGS. 10A-10I are pictorial representations (through cross sectional views) depicting the basic processing steps employed in a still further embodiment for fabricating a single-damascene interconnect structure using patternable dielectrics according to the present disclosure.

FIG. 10A illustrates an initial structure that is utilized in this embodiment. The initial structure includes a substrate 100, an optional dielectric cap 200 located on a surface of substrate 100, and optional antireflective coating 300 located on a surface of the optional dielectric cap 200.

The optional dielectric cap 200 is formed directly on the surface of substrate 100 utilizing a conventional deposition process such as, for example, chemical vapor deposition (CVD), plasma enhanced chemical vapor deposition (PECVD), atomic layer deposition (ALD), chemical solution deposition (such as spin coating), or evaporation.

After the deposition of the dielectric cap 200, a post deposition treatment may be applied to modify the properties of either the entire layer or the surface of the dielectric cap 200. This post deposition treatment can be selected from heat treatment, irradiation of electromagnetic wave (such as of ultraviolet light), particle beam (such as an electron beam, or an ion beam), plasma treatment, chemical treatment through a gas phase or a liquid phase (such as application of a monolayer of surface modifier) or any combination thereof. This post-deposition treatment can be blanket or pattern-wise.

The heat treatment should be no high than the temperature that the underlying substrate can withstand, usually 500° C. This heat treatment can be conducted in an inert environment or within a chemical environment in a gas phase or a liquid phase. This treatment step may or may not be performed in the same tool as that used in forming the dielectric cap 200.

The post deposition treatment by irradiation of electromagnetic wave can be by ultra-violet (UV) light, microwave and the like. The post deposition treatment by plasma treatment can be selected from oxidizing plasma, reducing plasma or a neutral plasma.

Next, an optional antireflective coating (ARC) 300 is formed on a surface of the optional dielectric cap 200, if present, or directly on a surface of the substrate 100 when the dielectric cap 200 is not present. In one embodiment, the ARC 300 is included within the structure. ARC 300 may be a single layer, multilayer or a graded layer with a composition that varies along the vertical direction.

Figure 10B:
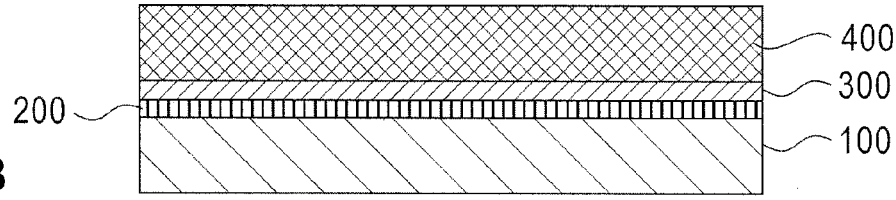

Next, and as illustrated in FIG. 10B, a first photoresist 400, which combines the function of a photoresist and low-k material into one single material is provided. In the embodiment illustrated, the photoresist 400 is provided on the surface of the ARC 300. In other embodiments, the first photoresist 400 can be provided directly on the dielectric cap 200 (when no ARC 300 is present) or directly on the surface of substrate 100 (when neither ARC 300 nor dielectric cap 200 is present).

Figure 10C:
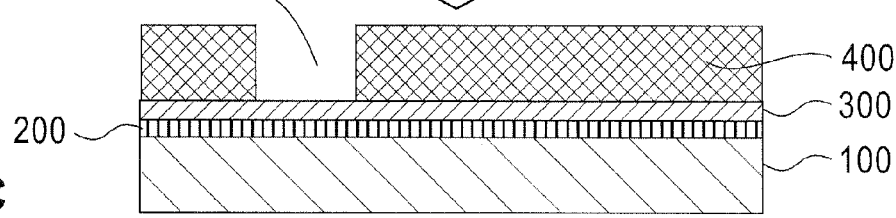
Figure 10D:
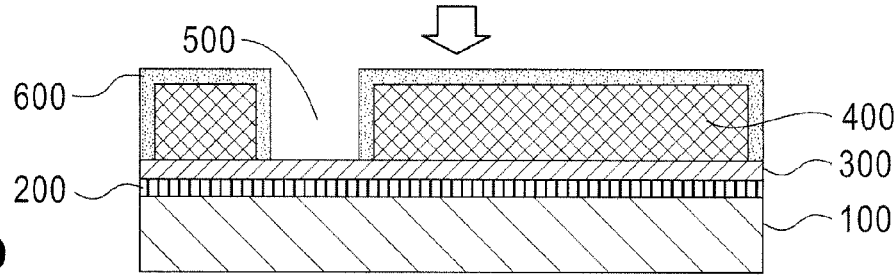

Next, and as shown in FIG. 10C, the first patternable low-k dielectric material 400 is pattern-wise exposed to form latent images of an interconnect pattern. An optional post-exposure baking may be required to effect the photochemical reactions.

Specifically, FIG. 10C illustrates the structure that is formed after forming the interconnect pattern 500 within the first patternable low-k film 400. The interconnect pattern 500 exposes a surface of the ARC 300, if present.

After patterning the first photoresist 400, resist fortification is carried out according to the present disclosure. The fortification process forms the layer 600 on the sidewalls and top of the photoresist 400 (see FIG. 10D).

Figure 10E:
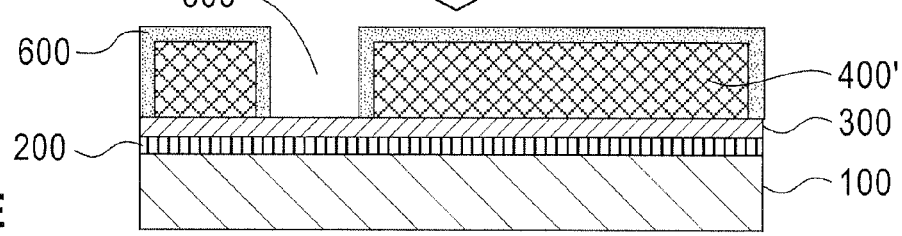

After patterning the first photoresist 400, a second photoresist 850 is then formed providing the structure shown in FIG. 10E. As shown, the second photoresist completely fills the at least one via pattern 500 and extends onto an upper surface of the first photoresist. The second photoresist 850 may comprise the same or different material as the first photoresist 400. The deposition processes and thickness mentioned above for the first photoresist 400 are each applicable here for the second photoresist 800. Typically, the first photoresist 400 is a positive-tone material, and the second low-k material 850 is either a negative-tone or a positive-tone material.

Figure 10F:
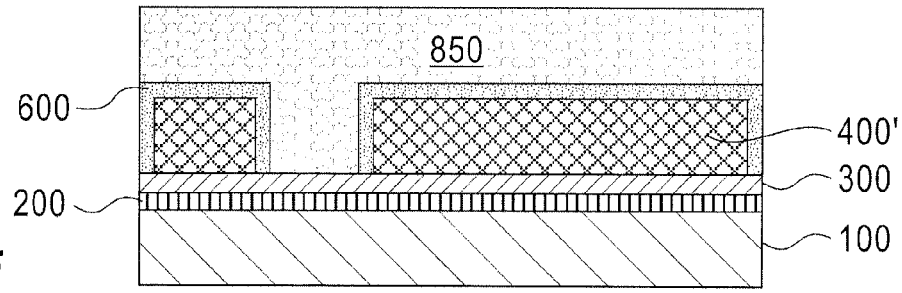
Figure 10G:
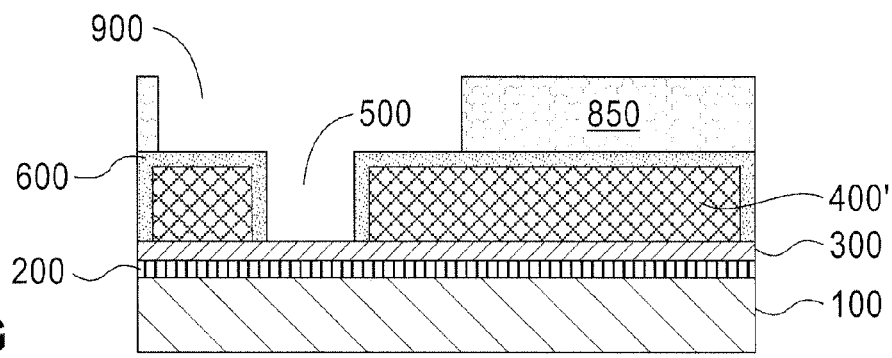

Next, and as shown in FIG. 10F, the second patternable low-k dielectric material 850 is patterned to form at least one second interconnect pattern 900 within the second patternable low-k dielectric material 850. It is noted that during the at least one second interconnect pattern 900 formation a portion of the second photoresist remains in the at least one first interconnect pattern 500 of the first dimension providing a final interconnect via pattern. The patterning of the second patternable low-dielectric material 850 is performed utilizing the same basic processing equipment, conditions and steps as those used for patterning the first patternable low-k dielectric material 400. The at least one second interconnect pattern 900 is the other of a via pattern or a trench pattern not employed as the at least one first interconnect pattern 500.

After patterning the second photoresist 400, resist fortification is carried out according to the present disclosure. See FIG. 10G. The fortification process forms the layer 1000 on the sidewalls and top of the photoresist 850.

Figure 10H:
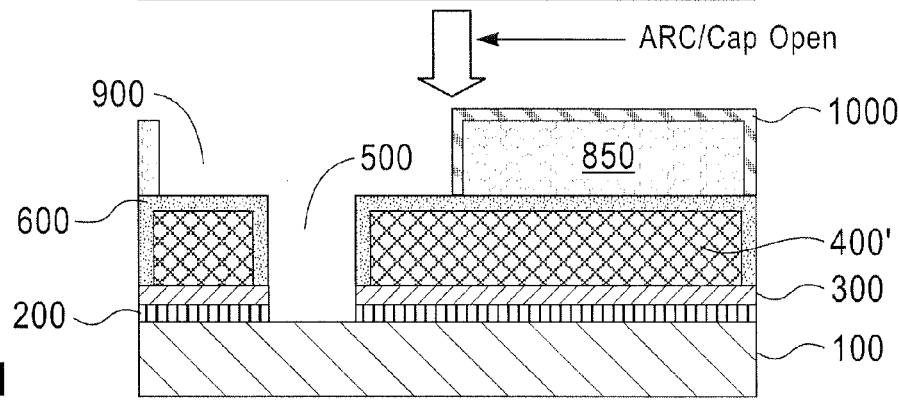

Next via contacts are formed through the ARC/cap layer to form contact with the underlying substrates (FIG. 10H). These via contacts can be formed with the reactive ion etching process well known to those skilled in the art. Layers 300 and 200 are first opened by etching via contacts through those layers and exposing a surface of the conductive feature in the substrate 100 using the patterned and cured patternable low-k interconnect structure as an etch mask.

After forming the interconnect pattern 900, carrying out fortification and forming the via contacts, the low-k material 850 is cured forming a cured low-k material 850' (see, FIG. 10H). In FIG. 10H, reference numeral 850' denotes the cured second low-k material. The cured second low-k material 850' has a dielectric constant within the ranges mentioned above. This curing step also cures the first photoresist 400 into a cured low-k material 400'.

Figure 10I:
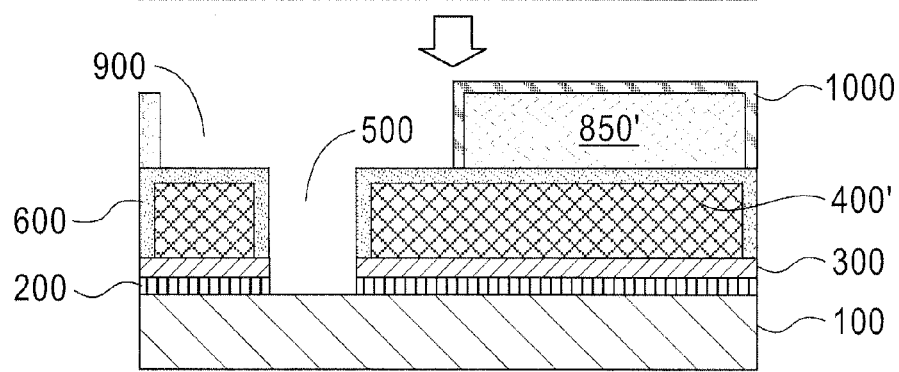
Figure 10J:
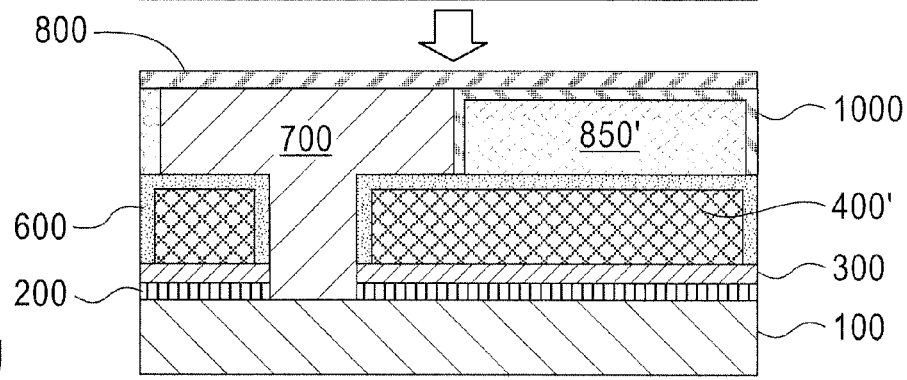

The conductive material is then filled into the opening contacting the conductive material in the substrate 100 as shown in FIG. 10I. This includes etching through the ARC 300 and dielectric cap 200 if present, utilizing an etching process such as, for example, reactive ion etching. An optional diffusion barrier liner (not shown) can be formed in the via.

Following the formation of the diffusion barrier liner, the remaining region of the via and trench patterns is filled with a conductive material 700 forming a conductive feature.

After deposition, a conventional planarization process such as, for example, chemical mechanical polishing (CMP) can be used to provide a structure in which the diffusion barrier liner and the conductive material 700 each have an upper surface that is substantially coplanar with the upper surface of the cured low-k material 850'.

After forming the conductive material 700, another dielectric cap 800 is formed on the surface 1000 of the cured low-k material 850' utilizing a conventional deposition process such as, for example, chemical vapor deposition (CVD), plasma enhanced chemical vapor deposition (PECVD), atomic layer deposition (ALD), chemical solution deposition, or evaporation. The dielectric cap comprises any suitable dielectric capping material such as, for example, SiC, SiN, $SiO_2$, a carbon doped oxide, a nitrogen and hydrogen doped silicon carbide SiC(N,H) or multilayers thereof. This dielectric cap can be a continuous layer or a discontinuous layer. It can also be a select cap, such as CoWP.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method for fabricating an interconnect structure which comprises:
    depositing a photoresist onto a semiconductor substrate, wherein the photoresist contains a low k dielectric constituent;
    imagewise exposing the photoresist to actinic radiation;
    then forming a pattern of vias or trenches in the photoresist;
    surface fortifying the photoresist pattern proving a fortification layer on the top and sidewalls of the patterned photoresist;
    curing the patterned photoresist thereby converting the photoresist into a dielectric; and filling the vias and trenches with a conductive fill material.

2. The method according to claim 1, wherein the surface fortifying is at least one member selected from the group consisting of irradiation of electromagnetic wave, particle beam, plasma treatment, chemical treatment through a gas phase or a liquid phase.

3. The method of claim 1 further comprising forming an antireflective coating between the substrate and the photoresist wherein the antireflective coating is opened prior to filling the interconnect via pattern and the trench pattern with a conductive material.

4. The method of claim 3 further comprising forming a dielectric cap between the antireflective coating and the substrate, wherein the antireflective coating and the cap layer both are opened prior to filling the first interconnect pattern and the second interconnect pattern with a conductive material.

5. The method of claim 1 wherein the photoresist comprises a polymer, a copolymer, a blend including at least two of any combination of polymers and/or copolymers, wherein said polymers include one monomer and said copolymers include at least two monomers and wherein said monomers of said polymers and said monomers of said copolymers are selected from a siloxane, silane, carbosilane, oxycarbosilane, silsesquioxane, alkyltrialkoxysilane, tetra-alkoxysilane, unsaturated alkyl substituted silsesquioxane, unsaturated alkyl substituted siloxane, unsaturated alkyl substituted silane, an unsaturated alkyl substituted carbosilane, unsaturated alkyl substituted oxycarbosilane, carbosilane substituted silsesquioxane, carbosilane substituted siloxane, carbosilane substituted silane, carbosilane substituted carbosilane, carbosilane substituted oxycarbosilane, oxycarbosilane substituted silsesquioxane, oxycarbosilane substituted siloxane, oxycarbosilane substituted silane, oxycarbosilane substituted carbosilane, and oxycarbosilane substituted oxycarbosilane.

6. A method for fabricating dual-damascene interconnect structure which comprises:
    depositing a first photoresist onto a semiconductor substrate, wherein the photoresist contains a low k dielectric constituent;
    imagewise exposing the first photoresist to actinic radiation;
    then forming a pattern of vias or trenches in the first photoresist;
    then surface fortifying the first photoresist pattern proving a fortification layer on the top and sidewalls of the first photoresist;
    depositing a second photoresist on top of the first photoresist, wherein the second photoresist contains a low k dielectric constituent;
    imagewise exposing the second photoresist to actinic radiation;
    then forming a pattern of the other of vias or trenches in the second photoresist, that were not formed in the first photoresist;
    then surface fortifying the second photoresist pattern proving a fortification layer on the top and sidewalls of the second photoresist;
    curing the patterned first and second photoresists thereby converting the first and second photoresists into a dielectric; and
    filling the vias and trenches with a conductive fill material.

7. The method according to claim 6, wherein the surface fortifying comprises plasma processing.

8. The method of claim 6 further comprising forming an antireflective coating between the substrate and the first photoresist wherein the antireflective coating is opened prior to filling the interconnect via pattern and the trench pattern with a conductive material.

9. The method of claim 8 further comprising forming a dielectric cap between the antireflective coating and the substrate, wherein the antireflective coating and the cap layer both are opened prior to filling the first interconnect pattern and the second interconnect pattern with a conductive material.

10. The method of claim 6 wherein each photoresist comprises a polymer, a copolymer, a blend including at least two of any combination of polymers and/or copolymers, wherein said polymers include one monomer and said copolymers include at least two monomers and wherein said monomers of said polymers and said monomers of said copolymers are selected from a siloxane, silane, carbosilane, oxycarbosilane, silsesquioxane, alkyltrialkoxysilane, tetra-alkoxysilane, unsaturated alkyl substituted silsesquioxane, unsaturated alkyl substituted siloxane, unsaturated alkyl substituted silane, an unsaturated alkyl substituted carbosilane, unsaturated alkyl substituted oxycarbosilane, carbosilane substituted silsesquioxane, carbosilane substituted siloxane, carbosilane substituted silane, carbosilane substituted carbosilane, carbosilane substituted oxycarbosilane, oxycarbosilane substituted silsesquioxane, oxycarbosilane substituted siloxane, oxycarbosilane substituted silane, oxycarbosilane substituted carbosilane, and oxycarbosilane substituted oxycarbosilane.

* * * * *